United States Patent
Takojima et al.

(10) Patent No.: US 11,094,859 B2
(45) Date of Patent: Aug. 17, 2021

(54) LIGHT EMITTING APPARATUS

(71) Applicant: TOSHIBA HOKUTO ELECTRONICS CORPORATION, Asahikawa (JP)

(72) Inventors: Naoki Takojima, Asahikawa (JP); Yojiro Yarimizu, Asahikawa (JP); Tsuyoshi Abe, Asahikawa (JP)

(73) Assignee: Toshiba Hokuto Electronics Corporation, Asahikawa (JP)

( * ) Notice: Subject to any disclaimer, the term of this patent is extended or adjusted under 35 U.S.C. 154(b) by 0 days.

(21) Appl. No.: 16/546,695

(22) Filed: Aug. 21, 2019

(65) Prior Publication Data

US 2020/0075874 A1 Mar. 5, 2020

(30) Foreign Application Priority Data

Sep. 3, 2018 (JP) .............................. JP2018-164946

(51) Int. Cl.
| | |
|---|---|
| *H01L 33/56* | (2010.01) |
| *H01L 51/00* | (2006.01) |
| *H01L 51/52* | (2006.01) |
| *B32B 27/36* | (2006.01) |
| *H01L 33/52* | (2010.01) |

(Continued)

(52) U.S. Cl.
CPC .............. *H01L 33/56* (2013.01); *B32B 27/36* (2013.01); *H01L 33/44* (2013.01); *H01L 33/52* (2013.01); *H01L 51/0097* (2013.01); *H01L 51/5203* (2013.01); *H01L 51/5246* (2013.01); *H01L 51/5256* (2013.01); *B32B 2038/0076* (2013.01);

(Continued)

(58) Field of Classification Search
CPC ............. H01L 51/0097; H01L 51/5246; H01L 51/5256; H01L 2251/30; H01L 33/52; H01L 33/56; H01L 33/44; B32B 27/36; B32B 2038/0076; F21Y 2115/10
See application file for complete search history.

(56) References Cited

U.S. PATENT DOCUMENTS

| | | | | |
|---|---|---|---|---|
| 2012/0232209 | A1* | 9/2012 | Masuda | ................. C08L 25/06 524/506 |
| 2012/0300306 | A1* | 11/2012 | Nagahama | ............ G02B 5/045 359/601 |

(Continued)

FOREIGN PATENT DOCUMENTS

JP  2012-084855 A1  4/2012

OTHER PUBLICATIONS

U.S. Appl. No. 16/803,258, filed Feb. 27, 2020, Akira Ishigai.
U.S. Appl. No. 16/803,303, filed Feb. 27, 2020, Naoki Takojima.

*Primary Examiner* — Feifei Yeung Lopez
(74) *Attorney, Agent, or Firm* — Burr & Brown, PLLC

(57) ABSTRACT

Disclosed is a light emitting apparatus including: a first substrate having light transmissive property and flexibility with a conductive layer; a second substrate having light transmissive property and flexibility and arranged to face the first substrate; a plurality of light emitting elements including an electrode connected to the conductive layer and arranged between the first and second substrates; and a resin layer having light transmissive property and flexibility and arranged between the first and second substrates to hold the plurality of light emitting elements. A temperature for a maximum mechanical loss tangent tan δ in dynamic viscoelasticity of the resin layer is 117° C. or higher.

11 Claims, 21 Drawing Sheets

(51) Int. Cl.
   *H01L 33/44*   (2010.01)
   *B32B 38/00*   (2006.01)
   *F21Y 115/10*  (2016.01)

(52) U.S. Cl.
   CPC ....... *F21Y 2115/10* (2016.08); *H01L 2251/30* (2013.01)

(56) References Cited

U.S. PATENT DOCUMENTS

2016/0276561 A1    9/2016  Maki
2017/0250330 A1*   8/2017  Maki .................. H01L 33/06
2019/0002617 A1*   1/2019  Kotani ................ C08F 8/26

* cited by examiner

FIG.16

| CONDITION | TEMPERATURE | HUMIDITY | NUMBER OF NON-DEFECTIVES (COUNT) | | |
| --- | --- | --- | --- | --- | --- |
| | | | RESIN A | RESIN B | RESIN C |
| 1 | 85°C | 30% | 8 | 10 | 10 |
| 2 | 85°C | 50% | 6 | 10 | 10 |
| 3 | 85°C | 85% | 5 | 10 | 10 |

FIG.23

| RESIN | BENDING STRESS (MPa) | | CHANGE RATE FROM 23°C TO 85°C |
|---|---|---|---|
| | 23°C | 85°C | |
| A | 5.95 | 1.48 | −75.2% |
| B | 94.92 | 65.71 | −30.8% |
| C | 123.67 | 99.20 | −19.8% |

LIGHT EMITTING APPARATUS

CROSS-REFERENCE TO RELATED APPLICATIONS

This application is based upon and claims the benefit of priority from the prior Japanese Patent Application No. 2018-164946 filed in Japan on Sep. 3, 2018; the entire contents of which are incorporated herein by reference.

FIELD

Embodiments of this disclosure generally relate to a light emitting apparatus.

BACKGROUND

In recent years, emphasis has been placed on efforts to reduce energy consumption. From such a background, light emitting diodes (LEDs) are attracting attention as a next-generation light source due to having relatively low power consumption. LEDs have a small size, generate less heat, and have excellent responsiveness. For this reason, LEDs are widely used in various optical devices.

For example, a light emitting apparatus has been recently proposed, in which LEDs arranged on a substrate having flexibility and light transmissive property are used as a light source. In cases where such a type of light emitting apparatus is used in an outdoor environment or on a vehicle, it is necessary to configure the light emitting apparatus using a substrate or resin capable of enduring use in a high-temperature and high-humidity place.

In particular, the resin used to hold the light emitting element on the substrate has characteristics such as viscoelasticity that change as a temperature or humidity changes. A significant change in the viscoelasticity of the resin causes a contact failure between the conductor layer of the substrate and the electrode of the LED.

BRIEF DESCRIPTION OF THE DRAWINGS

FIG. 16 is a table showing the number of non-defectives when the light emitting apparatus is operated for 1000 hours;

FIG. 23 is a table showing bending stress measurement results for the resin A to C;

DETAILED DESCRIPTION

According to an embodiment of this disclosure, there is provided a light emitting apparatus including: a first substrate having light transmissive property and flexibility with a conductive layer; a second substrate having light transmissive property and flexibility and arranged to face the first substrate; a plurality of light emitting elements including an electrode connected to the conductive layer and arranged between the first and second substrates; and a resin layer having light transmissive property and flexibility and arranged between the first and second substrates to hold the plurality of light emitting elements. A temperature for a maximum mechanical loss tangent tan δ in dynamic viscoelasticity of the resin layer is 117° C. or higher.

An embodiment of this disclosure will now be described with reference to the accompanying drawings. The following description will be made on the basis of an XYZ coordinate system consisting of an X-axis, a Y-axis, and a Z-axis perpendicular to each other.

Figure 1:
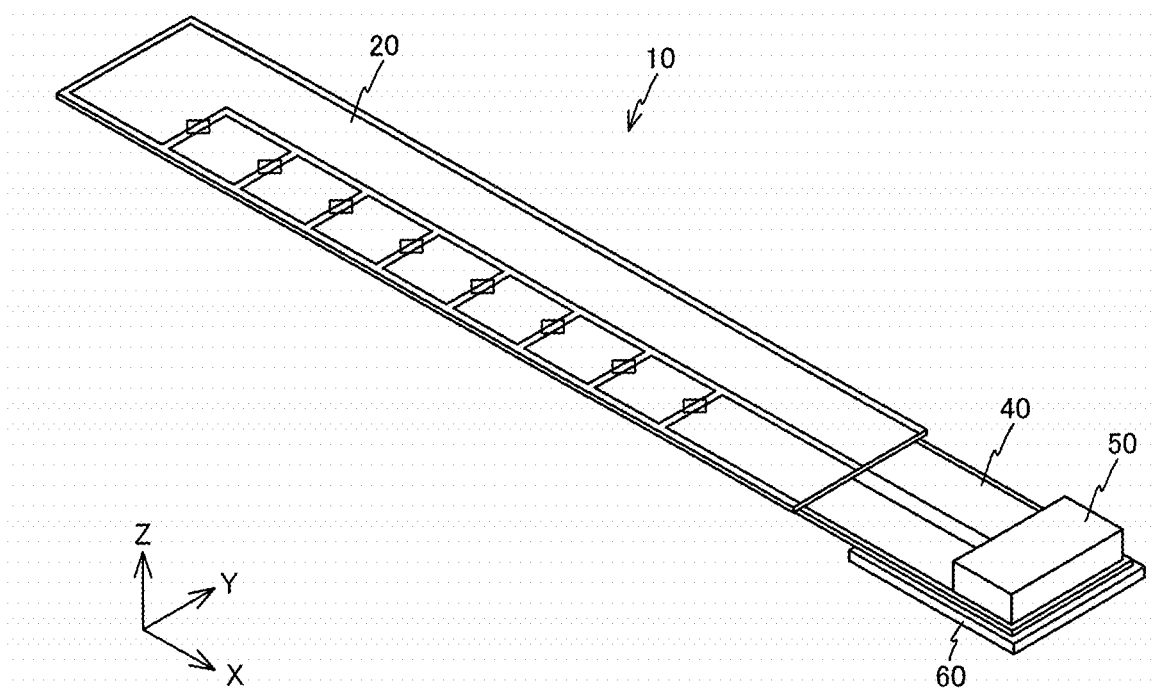
FIG. 1 is a perspective view illustrating a light emitting apparatus.
Figure 2:
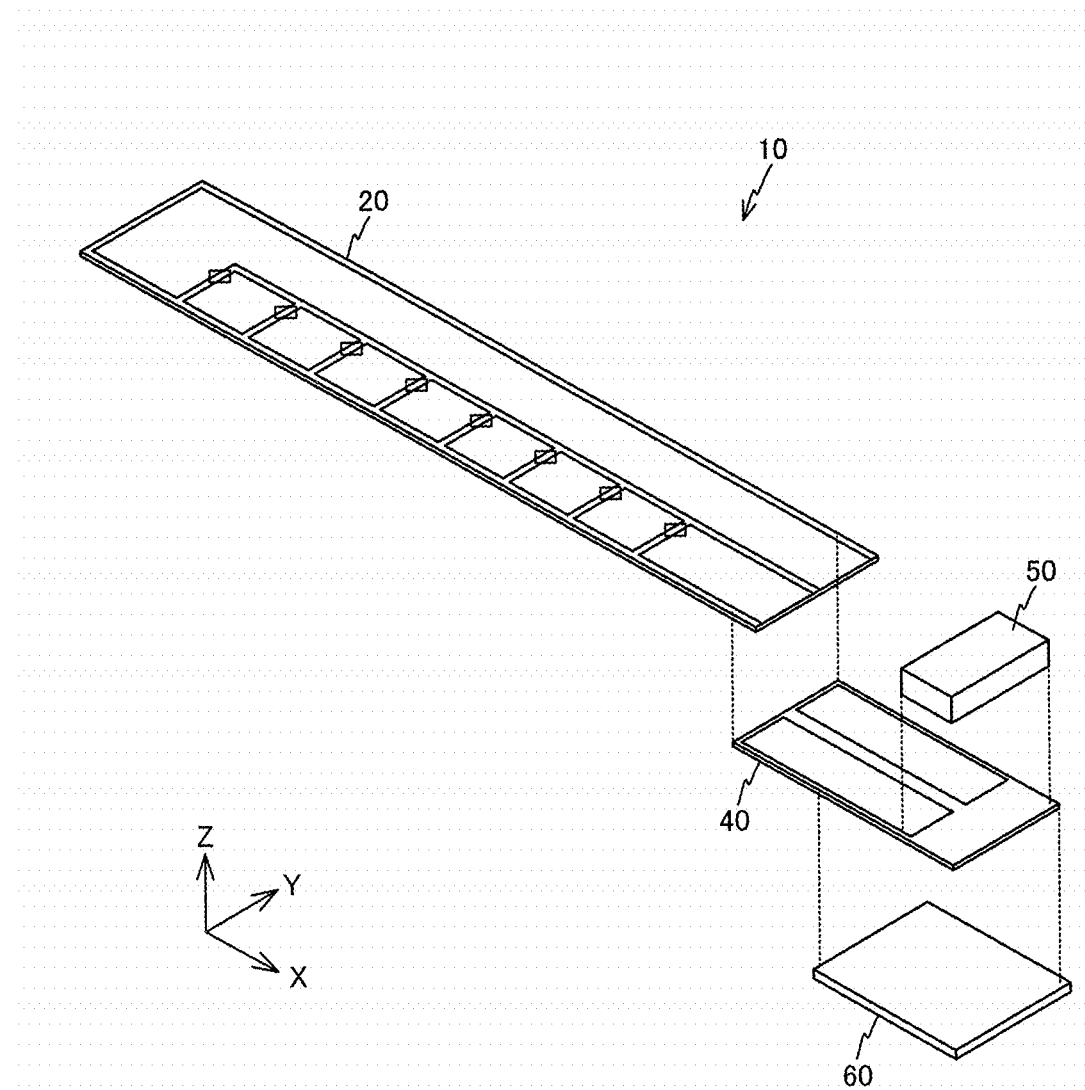
FIG. 2 is an exploded perspective view illustrating the light emitting apparatus.

FIG. 1 is a perspective view illustrating a light emitting apparatus 10 according to this embodiment. In addition, FIG. 2 is an exploded perspective view illustrating the light emitting apparatus 10. As recognized from FIGS. 1 and 2, the light emitting apparatus 10 has a light emitting panel 20 with a longitudinal direction set in the X-axis direction, a flexible cable 40 connected to the light emitting panel 20, and a connector 50 and a reinforcing plate 60 provided in the flexible cable 40.

Figure 3:
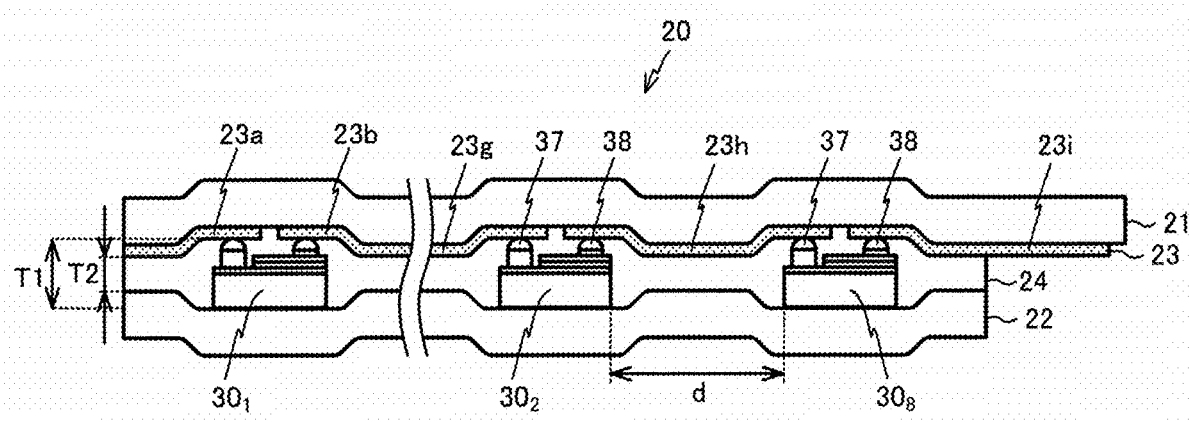
FIG. 3 is a side view illustrating a light emitting panel.

FIG. 3 is a side view illustrating the light emitting panel 20. As illustrated in FIG. 3, the light emitting panel 20 has a set of substrates 21 and 22 and a resin layer 24 interposed between the substrates 21 and 22, and eight light emitting elements $30_1$ to $30_8$ arranged inside the resin layer 24.

The substrates 21 and 22 are film-like members with a longitudinal direction set in the X-axis direction. The substrates 21 and 22 have a thickness of approximately 50 to 300 μm and transmit visible light. The substrates 21 and 22 preferably have a total light ray transmittance of approximately 5 to 95%. Note that the total light ray transmittance refers to a total light transmittance measured on the basis of Japanese Industrial Standard JISK7375:2008.

The substrates 21 and 22 have flexibility and a flexural modulus of approximately 0 to 320 kgf/mm$^2$ (excluding zero). Note that the flexural modulus is a value measured by a method based on the standard ISO178 (JISK7171: 2008).

The substrates 21 and 22 may be formed of polyethylene terephthalate (PET), polyethylene naphthalate (PEN), polycarbonate (PC), polyethylene succinate (PES), ARTON, acrylic resin, or other similar materials.

Out of the set of the substrates 21 and 22, a conductor layer 23 having a thickness of approximately 0.05 to 10 μm is formed on a lower surface of the substrate 21 (on a −Z-side surface in FIG. 3). The conductor layer 23 is, for example, a deposited film or a sputtered film. In addition, the conductor layer 23 may be formed by bonding a metal film with an adhesive. In a case where the conductor layer 23 is a deposited film or a sputtered film, the conductor layer 23 has a thickness of approximately 0.05 to 2 μm. If the conductor layer 23 is formed by bonding a metal film, the conductor layer 23 has a thickness of approximately 2 to 10 μm, or 2 to 7 μm. The conductor layer 23 is a metal layer formed of a metal material such as copper (Cu) or silver (Ag).

Figure 4:
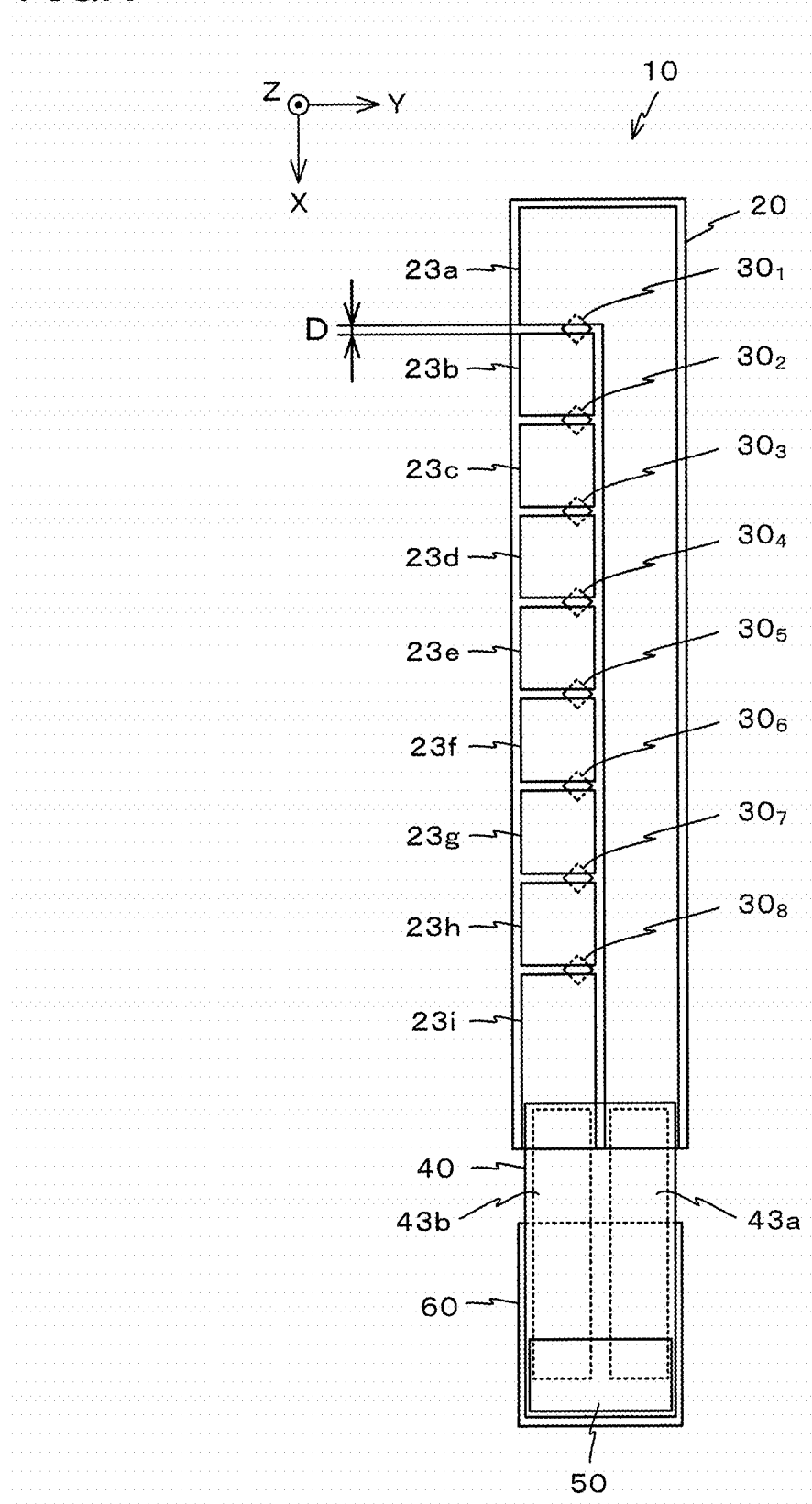
FIG. 4 is a plan view illustrating a light emitting apparatus.

FIG. 4 is a plan view illustrating the light emitting apparatus 10. As recognized from FIG. 4, the conductor layer 23 has a L-shaped conductor pattern 23a formed along a +Y-side outer edge of the substrate 21, and rectangular conductor patterns 23b to 23i arranged along the −Y-side outer edge of the substrate 21. In the light emitting apparatus 10, a distance D between the conductor patterns 23a to 23i is approximately 100 μm or shorter.

Figure 5:
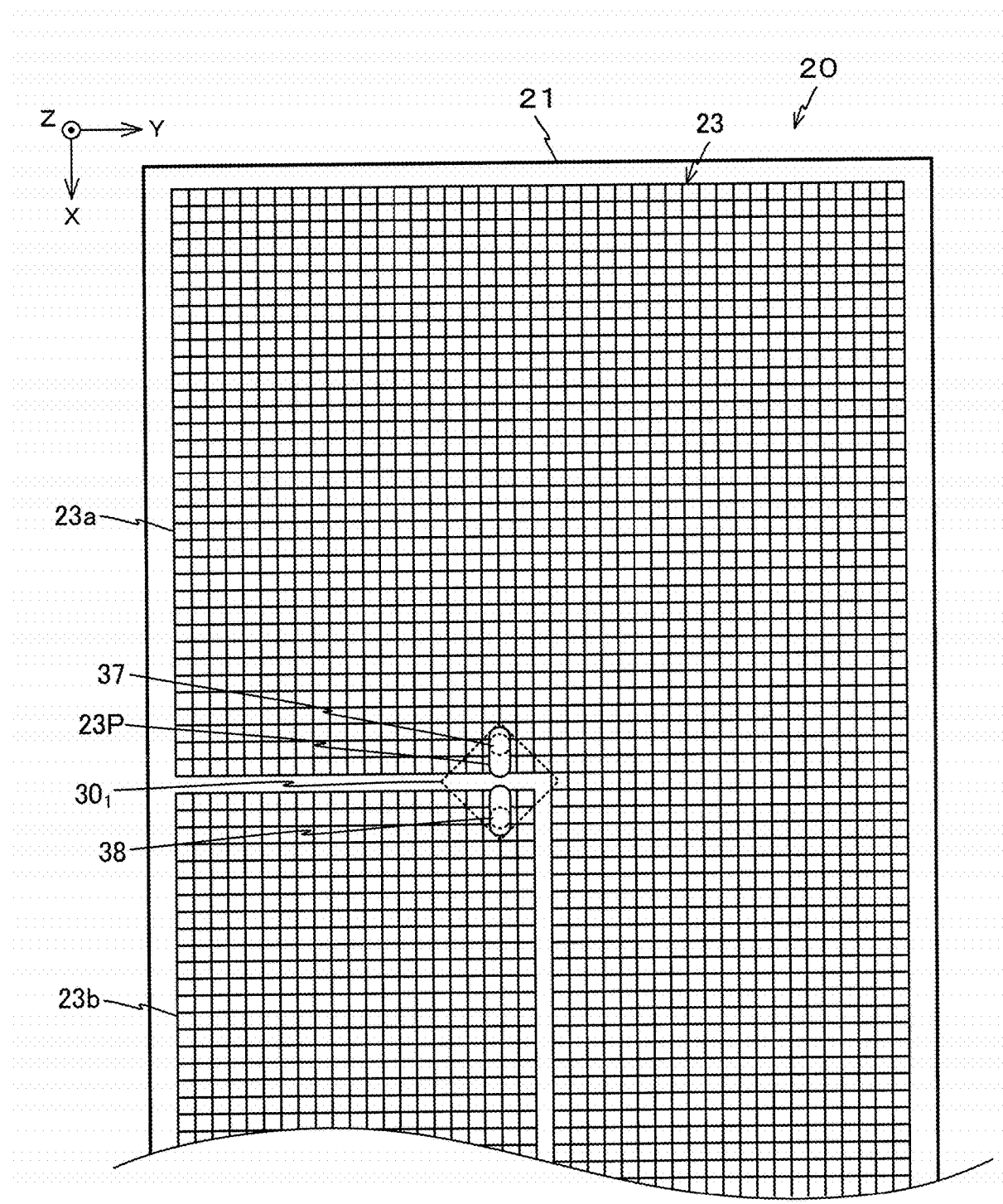
FIG. 5 is a diagram illustrating a light emitting element connected to a conductor layer.

FIG. 5 is a partial enlarged view illustrating the conductor patterns 23a and 23b. As illustrated in FIG. 5, the conductor patterns 23a to 23i are mesh patterns formed of line patterns with a line width of approximately 5 μm. The line patterns placed in parallel with the X-axis are formed along the Y-axis with an interval of approximately 150 μm. In addition, the line patterns placed in parallel with the Y-axis are formed along the X-axis with an interval of approximately 150 μm. Each of the conductor patterns 23a to 23i has a pad 23P to which the electrodes of the light emitting elements $30_1$ to $30_8$ are connected.

In the light emitting apparatus 10, the substrate 22 has a length of the X-axis direction shorter than that of the substrate 21. For this reason, as recognized from FIGS. 3 and 4, the +X-side ends of the conductor patterns 23a and 23i of the conductor layer 23 are exposed.

As illustrated in FIG. 3, the resin layer 24 is an insulator formed between the substrates 21 and 22. The resin layer 24 is formed of, for example, an epoxy-based thermosetting resin having light transmittance. The resin layer 24 preferably has, for example, a pre-curing minimum melt velocity VC1 of 10 to 10000 Pa·s within a temperature range of 80 to 160° C. In addition, it is preferable that the melt viscosity change rate VR until reaching a temperature T1 (most softening temperature) in the pre-curing minimum melt viscosity VC1 is set to $\frac{1}{1000}$ or lower. Furthermore, the resin layer 24 preferably has a Vicat softening temperature T2 of 80 to 160° C. after reaching the minimum melt viscosity through heating, that is, after the curing, and a tensile storage elastic modulus EM within a temperature range of 0 to 100° C. is preferably 0.01 to 1000 GPa. Furthermore, the resin layer 24 preferably has a glass transition temperature T3 of 100 to 160° C.

The melt viscosity is a value obtained by changing a temperature of a measurement target to 50° C. to 180° C. based on the method described in JIS K7233. The Vicat softening temperature is a value obtained by setting a test load of 10 N and a temperature increase rate of 50° C./hour based on the A50 method described in JIS K7206 (ISO 306: 2004). The glass transition temperature and the melting temperature are values obtained by differential scanning calorimetry based on the method in compliance with JIS K7121 (ISO 3146). The tensile storage elastic modulus is a value obtained based on the method in compliance with JIS K7244-1 (ISO 6721). Specifically, the tensile storage elastic modulus is a value obtained by sampling a measurement target increasing in temperature at an equal rate per 10° C. for one minute from −100° C. to 200° C. at a frequency of 10 Hz using a dynamic viscoelasticity auto meter.

The thickness T2 of the resin layer 24 is smaller than the height T1 of the light emitting elements $30_1$ to $30_8$ such that the conductor layer 23 and the bumps 37 and 38 come into suitable contact with each other. The substrates 21 and 22 adhering to the resin layer 24 have a curved shape such that portions where the light emitting elements $30_1$ to $30_8$ are arranged protrude outward, and portions between the light emitting elements $30_1$ to $30_8$ are hollowed. Since the substrates 21 and 22 are curved in this manner, the conductor layer 23 is pressed against the bumps 37 and 38 by virtue of the substrates 21 and 22. Therefore, it is possible to improve electrical connectability between the conductor layer 23 and the bumps 37 and 38, and the reliability thereof.

Note that the resin layer 24 is preferably formed of a material containing resin having a transmittance of at least 5% or higher and a thermosetting property as a main component, but it may contain another resin component as necessary. The resin having a thermosetting property may include epoxy-based resin, acryl-based resin, styrene-based resin, ester-based resin, urethane-based resin, melamine resin, phenolic resin, unsaturated polyester resin, diallyl phthalate resin, or other similar resins. Meanwhile, the thermoplastic resin may include polypropylene resin, polyethylene resin, polyvinyl chloride resin, acrylic resin, Teflon (registered trademark) resin, polycarbonate resin, acrylonitrile butadiene styrene resin, polyamide imide resin, or other similar resins. Among them, the epoxy-based resin is preferable as a material of the resin layer 24 because it has excellent flowability during softening, adhesiveness after curing, weather resistance, and other such properties in addition to light transmittance, electric insulation, flexibility, and other such properties. Naturally, the resin layer 24 may also formed of any resin other than epoxy-based resin.

Figure 6:
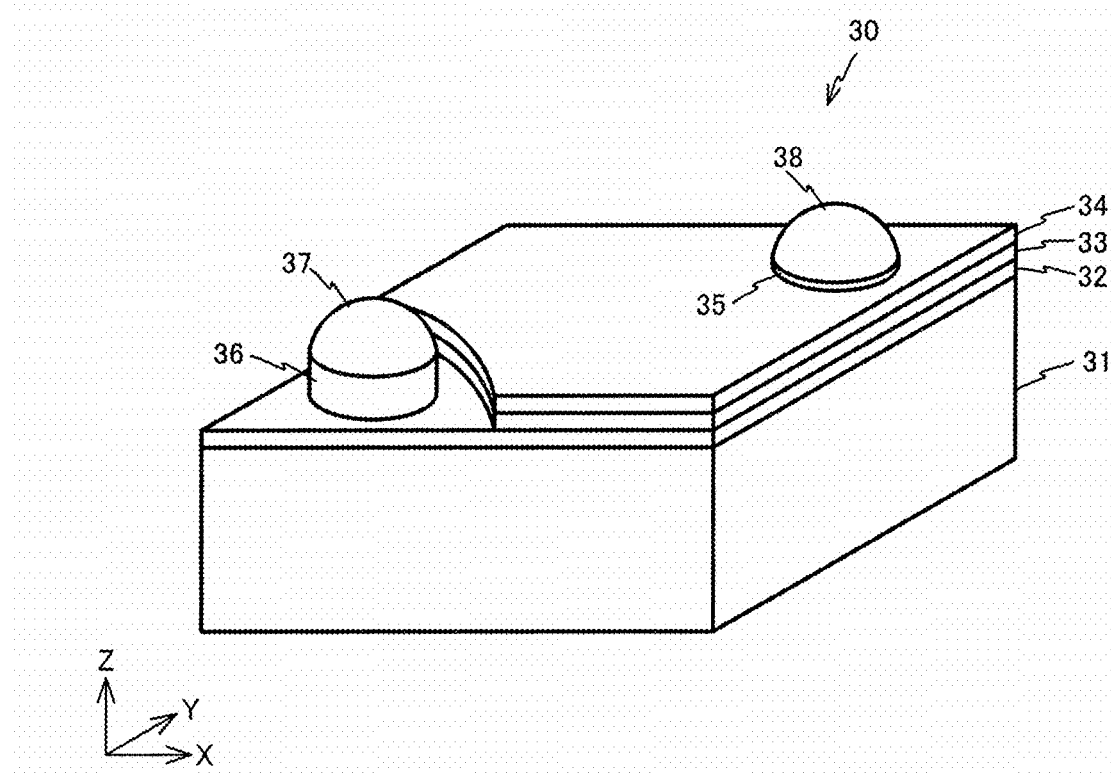
FIG. 6 is a perspective view illustrating a light emitting element.

The light emitting element $30_1$ is a square LED chip. As illustrated in FIG. 6, the light emitting element $30_1$ is a four-layer structure LED chip with a base substrate 31, an N-type semiconductor layer 32, an active layer 33, and a P-type semiconductor layer 34. A rated current of the light emitting element $30_1$ is set to approximately 50 mA.

The base substrate 31 is a square plate-shaped semiconductor substrate formed of GaAs, Si, GaP, or the like. An N-type semiconductor layer 32 with the same shape as that of the base substrate 31 is formed on an upper surface of the base substrate 31. In addition, an active layer 33 and a P-type semiconductor layer 34 are laminated sequentially on an upper surface of the N-type semiconductor layer 32. The active layer 33 and the P-type semiconductor layer 34 laminated on the N-type semiconductor layer 32 have notches in the corner portions of the −Y-side and the −X-side, so that a surface of the N-type semiconductor layer is exposed.

A portion of the N-type semiconductor layer 32 exposed from the active layer 33 and the P-type semiconductor layer 34 has a pad 36 electrically connected to the N-type semiconductor layer 32. In addition, a corner portion of the +X-side and the +Y-side of the P-type semiconductor layer 34 has a pad 35 electrically connected to the P-type semiconductor layer 34. The pads 35 and 36 are formed of copper (Cu) or gold (Au), and bumps 37 and 38 are formed on an upper surface of the pads 35 and 36. The bumps 37 and 38 are formed of solder and are shaped in a hemispherical shape. A metal bump made of, for example, gold (Au) or gold alloy may also be employed instead of a solder bump. In the light emitting element $30_1$, the bump 37 serves as a cathode, and the bump 38 serves as an anode.

As illustrated in FIG. 5, the light emitting element $30_1$ configured as described above is disposed between the conductor patterns 23a and 23b, the bump 37 is connected to the pad 23P of the conductor pattern 23a, and the bump 38 is connected to the pad 23P of the conductor pattern 23b.

The other light emitting elements $30_2$ to $30_8$ also have the same configuration as that of the light emitting element $30_1$. In addition, the light emitting element $30_2$ is disposed between the conductor patterns 23b and 23c, and the bumps 37 and 38 are connected to the conductor patterns 23b and 23c, respectively. Similarly, the light emitting element $30_3$ is arranged across the conductor patterns 23c and 23d. The light emitting element $30_4$ is arranged across the conductor patterns 23d and 23e. The light emitting element $30_5$ is arranged across the conductor patterns 23e and 23f. The light emitting element $30_6$ is arranged across the conductor patterns 23f and 23g. The light emitting element $30_7$ is arranged across the conductor patterns 23g and 23h. The light emitting element $30_8$ is arranged across the conductor patterns 23h and 23i. As a result, the conductor patterns 23a to 23i and the light emitting elements $30_1$ to $30_8$ are connected in series. In the light emitting panel 20, the light emitting elements $30_1$ to $30_8$ are arranged with an interval of approximately 10 mm.

Figure 7:
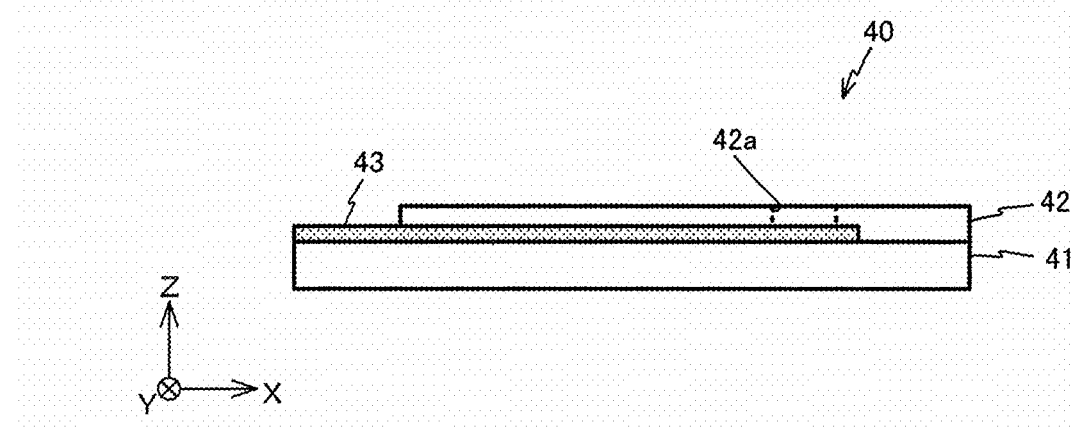
FIG. 7 is a side view illustrating a flexible cable.

FIG. 7 is a side view illustrating the flexible cable 40. As illustrated in FIG. 7, the flexible cable 40 includes a base material 41, a conductor layer 43, and a cover layer 42.

The base material 41 is a rectangular member with a longitudinal direction set in the X-axis direction. This base material 41 is formed of, for example, polyimide and has a conductor layer 43 on its upper surface. The conductor layer 43 is formed by patterning copper foil bonded to the upper surface of the polyimide. According to this embodiment, the conductor layer 43 includes a pair of conductor patterns 43a and 43b as illustrated in FIG. 4.

Returning to FIG. 7, the conductor layer 43 formed on the upper surface of the base material 41 is covered by a cover layer 42 subjected to vacuum thermocompression. This cover layer 42 has a length of the X-axis direction shorter than that of the base material 41. For this reason, the −X-side ends of the conductor patterns 43a and 43b of the conductor layer 43 are exposed. In addition, the cover layer 42 has an opening 42a, and the +X-side ends of the conductor patterns 43a and 43b are exposed from the opening 42a.

Figure 8:
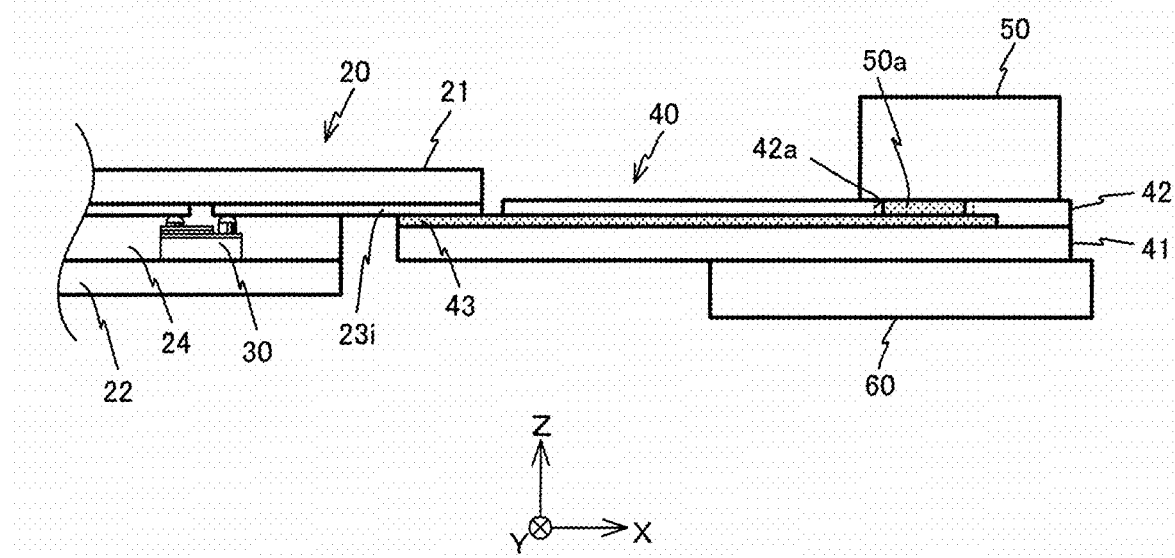
FIG. 8 is a diagram for describing how to connect the light emitting panel and the flexible cable.

As recognized from FIGS. 4 and 8, the flexible cable 40 configured as described above is bonded to the light emitting panel 20 while the conductor patterns 43a and 43b exposed from the cover layer 42 come into contact with the +X-side ends of the conductor patterns 23a and 23i of the light emitting panel 20.

As illustrated in FIG. 2, the connector 50 is a rectangular parallelepiped component to which a cable routed from a DC power supply is connected. The connector 50 is mounted on the upper surface of the +X-side end of the flexible cable 40. As the connector 50 is mounted to the flexible cable 40, each of a pair of terminals 50a of the connector 50 is connected to the conductor pattern 43a and 43b of the conductor layer 43 of the flexible cable 40 through the opening 42a provided in the cover layer 42 as illustrated in FIG. 8.

As illustrated in FIG. 2, the reinforcing plate 60 is a rectangular plate-shaped member with a longitudinal direction set in the X-axis direction. The reinforcing plate 60 is formed of, for example, epoxy resin or acryl. As illustrated in FIG. 8, the reinforcing plate 60 is bonded to the lower surface of the flexible cable 40. For this reason, the flexible cable 40 can be bent between the −X-side end of the reinforcing plate 60 and the +X-side end of the light emitting panel 20.

Figure 9:
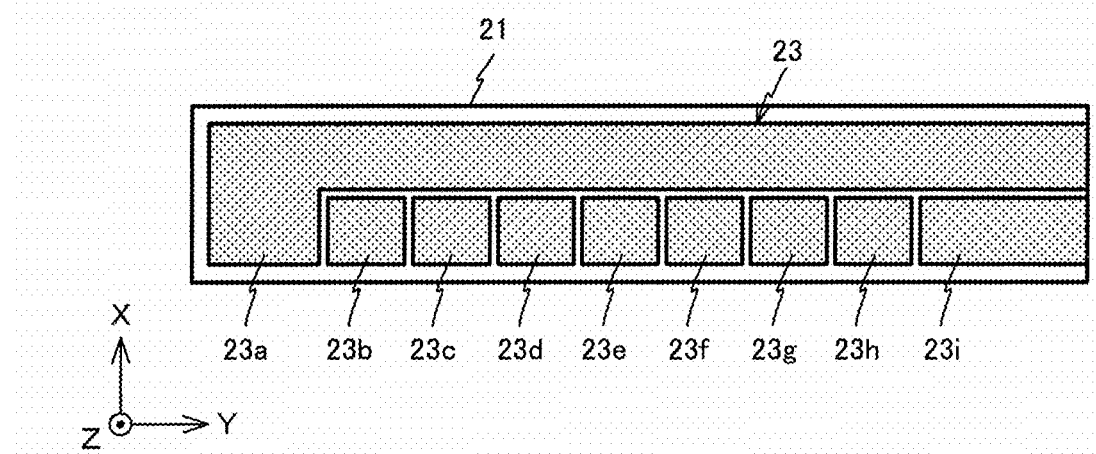
FIG. 9 is a diagram for describing how to fabricate the light emitting panel.

Next, a method of fabricating the light emitting panel 20 included in the aforementioned light emitting apparatus 10 will be described. First, as illustrated in FIG. 9, the substrate 21 formed of PET is prepared. In addition, the conductor layer 23 including the conductor patterns 23a to 23i is formed on a surface of the substrate 21. As an exemplary method of forming the conductor patterns 23a to 23i, a subtract method, an additive method, or other similar methods may be employed.

Figure 10:
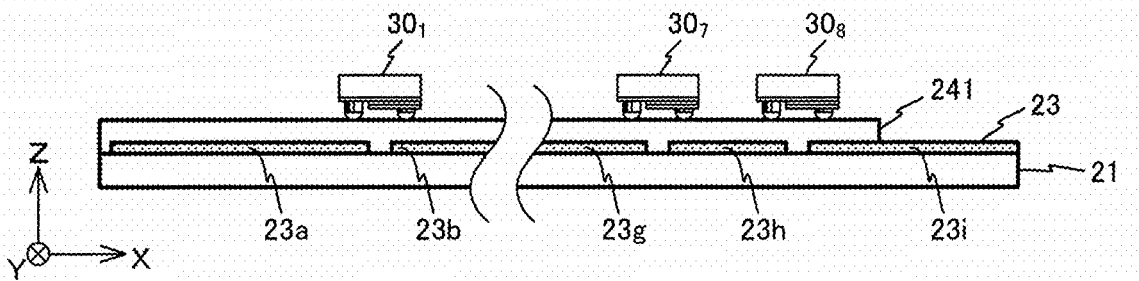
FIG. 10 is a diagram for describing how to fabricate the light emitting panel.

Then, as illustrated in FIG. 10, a resin sheet 241 with a thermosetting property is prepared on the surface of the substrate 21 on which the conductor patterns 23a to 23i are formed. The thickness of this resin sheet 241 is nearly equal to the height of the bumps 37 or 38 of the light emitting element 30. The resin sheet 241 is formed of, for example, epoxy-based resin. The resin sheet 241 is formed of, for example, elastomer with a thermosetting property. The resin sheet 241 is polymerized by increasing the temperature to a curing temperature, and becomes thermoplastic thereafter.

Then, the light emitting elements $30_1$ to $30_8$ are disposed on the resin sheet 241. In this case, the light emitting elements $30_1$ to $30_8$ are positioned such that the pads 23P of the conductor patterns 23a to 23i are placed directly under the bumps 37 and 38 of the light emitting element 30.

Figure 11:
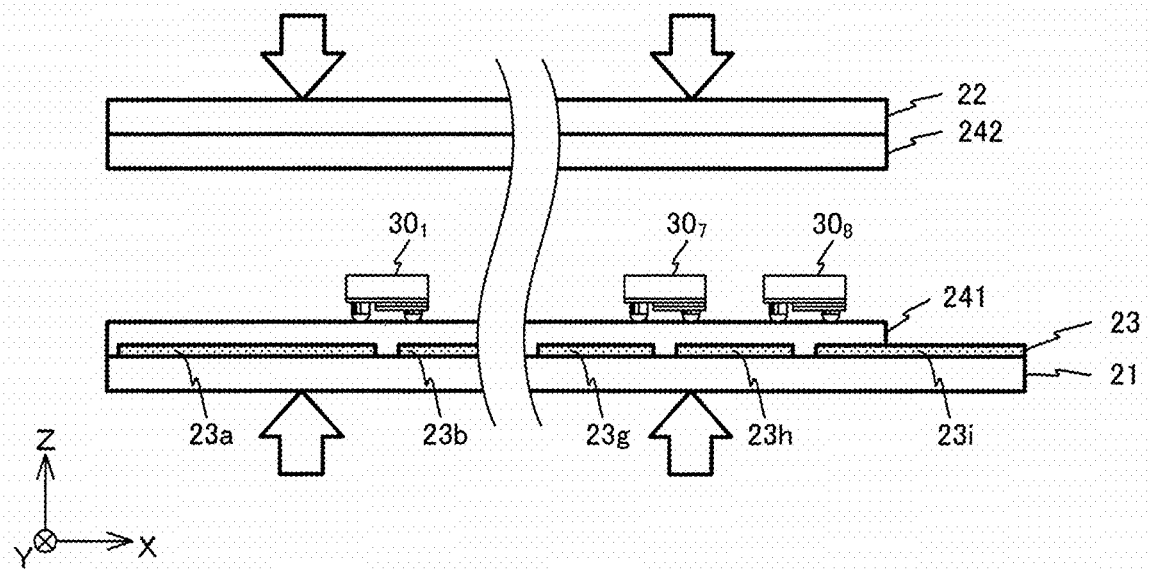
FIG. 11 is a diagram for describing how to fabricate the light emitting panel.

Then, as illustrated in FIG. 11, the substrate 22 which has an underlying resin sheet 242 with a thermosetting property on its lower surface is placed on the upper surface side of the substrate 21. The resin sheet 242 has the same property as that of the resin sheet 241.

Then, the substrates 21 and 22 are heated and pressure bonded in a vacuum atmosphere. As a result, first, the bumps 37 and 38 formed on the light emitting element 30 penetrate the resin sheet 241, reach the conductor layer 23, and are electrically connected to each of the conductor patterns 23a to 23i. In addition, the resin sheets 241 and 242, softened through heating, are filled around the light emitting element 30 without leaving a gap.

Then, the resin sheets 241 and 242 are cured. As a result, as illustrated in FIG. 3, the resin sheets 241 and 242 become the resin layer 24 that holds the light emitting elements $30_1$ to $30_8$ between the substrates 21 and 22. The light emitting panel 20 is thus completed.

As illustrated in FIG. 8, the flexible cable 40 bonded with the reinforcing plate 60 is connected to the light emitting panel 20 configured as described above, and the connector 50 is mounted to this flexible cable 40, so that the light emitting apparatus 10 of FIG. 1 is completed.

In the light emitting apparatus 10, if a DC voltage is applied to the conductor patterns 43a and 43b of FIG. 4 via the connector 50, the light emitting elements $30_1$ to $30_8$ of the light emitting panel 20 emit light.

In the light emitting panel 20 of the light emitting apparatus 10 described above, the substrates 21 and 22 formed of PET are bonded using the resin layer 24. If the light emitting apparatus 10 is used in a severe environment such as outdoors or in a high-temperature and high-humidity place, aging deterioration progresses relatively fast due to the influence of the temperature or humidity. For this reason, it is necessary to form the resin layer 24 using a resin material resistant to the high-temperature and high-humidity environment. In addition, in a place where changes in temperature or humidity are severe, the viscoelasticity of the resin layer 24 also changes depending on a change in temperature. For this reason, in a place where resin is hardened around a small area where an electrical connection of several tens of micrometers or smaller has been attained between the bumps 37 and 38 of the light emitting elements $30_1$ to $30_8$ held by the resin layer 24 and the pad 23P of the conductor patterns 23a to 23i, the light emitting elements $30_1$ to $30_8$ may be extinguished in some cases because the pad 23P and the bumps 37 and 38 are separated and the electrical contact is lost. In this regard, an optimum resin was selected for the resin layer 24.

When selecting the resin, ten light emitting apparatuses 10 were left on for 1000 hours as an example, in an environment with a temperature of 85° C. and a humidity of 85%, based on the assumption that the light emitting apparatus 10 will be used outdoors. Following this, the number of the light emitting apparatuses 10 that remained lit without failure was compared.

Note that the substrates 21 and 22 of the light emitting apparatus 10 used here have a thickness of 100 µm. The conductor layer 23 is formed of copper and has a thickness of 2 µm. The conductor patterns 23a to 23i are mesh patterns composed of line patterns with a line width of 5 µm and an array pitch of 300 µm. The resin layer 24 has a thickness of 120 µm and is made up of resin sheets 241 and 242, which each have a thickness of 60 µm.

Three types of the light emitting apparatuses 10 with the resin layer 24 formed of a resin A, a resin B, and a resin C respectively were prepared. Ten light emitting apparatuses 10 were prepared for each type. They were then turned on for 1000 hours under the aforementioned environment.

Figure 12:
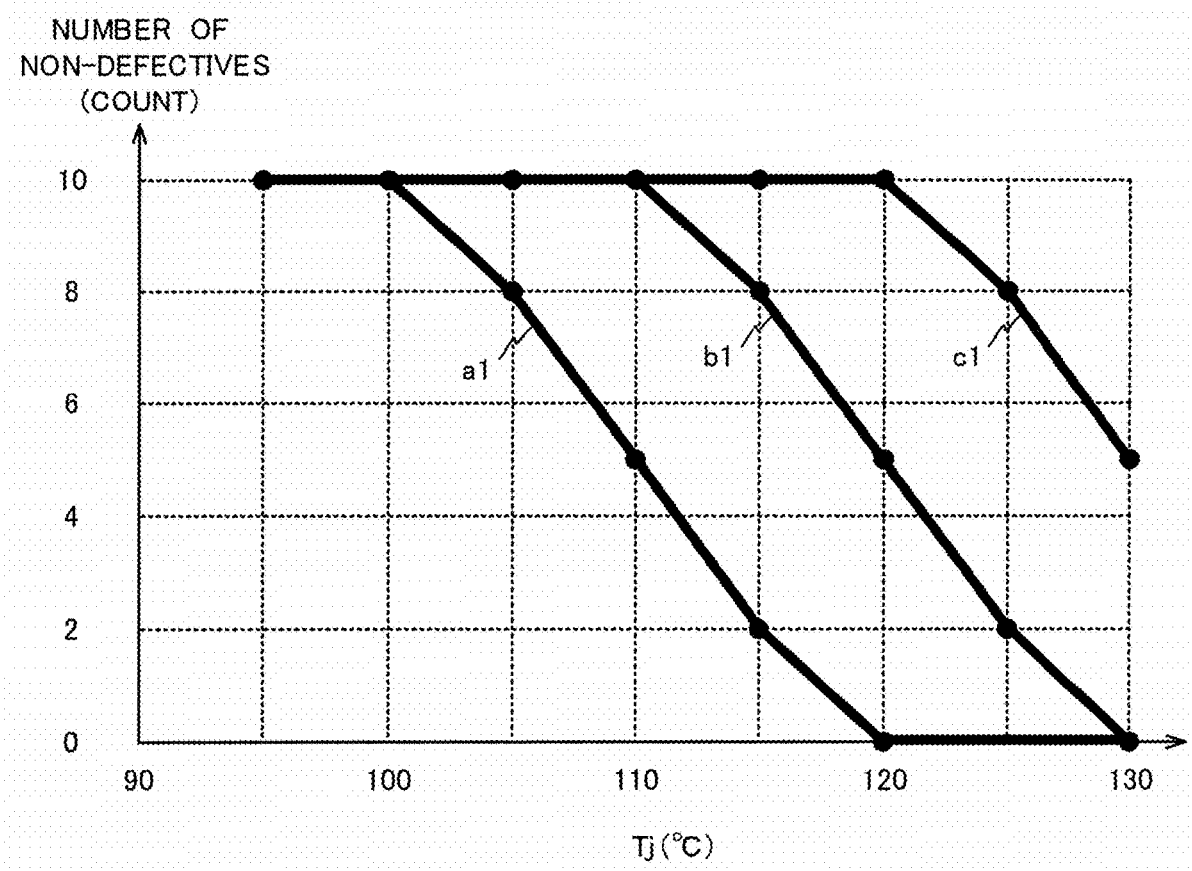
FIG. 12 is a diagram illustrating a relationship between a junction temperature and the number of non-defectives.

FIG. 12 is a diagram illustrating a relationship between a junction temperature Tj and the number of non-defectives when the light emitting apparatuses 10 were operated for 1000 hours. The plot a1 indicates a relationship between the number of non-defectives and the junction temperature in the light emitting apparatus 10 with the resin layer 24 formed of the resin A. The plot b1 indicates a relationship between the number of non-defectives and the junction temperature in the light emitting apparatus 10 with the resin layer 24 formed of the resin B. The plot c1 indicates a relationship between the number of non-defectives and the junction temperature in the light emitting apparatus 10 with the resin layer 24 formed of the resin C.

In the following description, for convenience purposes, the light emitting apparatus with the resin layer 24 formed of the resin A will be referred to as a light emitting apparatus 10A, the light emitting apparatus with the resin layer 24 formed of the resin B will be referred to as a light emitting apparatus 10B, and the light emitting apparatus with the resin layer 24 formed of the resin C will be referred to as a light emitting apparatus 10C. In addition, the environment with a temperature of 85° C. and a humidity of 85% will be defined here as the test environment. Furthermore, under the test environment, the junction temperature Tj is set to 105° C.

As illustrated in FIG. 12, in order to operate the light emitting apparatuses 10A, 10B, and 10C for 1000 hours without a failure under the test environment, it is necessary to set the temperature of the light emitting element of the light emitting apparatus 10A to 100° C. or lower. In addition, for the light emitting apparatuses 10B and 10C, it is necessary to set the temperature of the light emitting element to 110° C. or lower, or 120° C. or lower.

However, in a case where a current having a practical value is supplied to the light emitting elements $30_1$ to $30_8$ of the light emitting apparatus 10, the light emitting elements $30_1$ to $30_8$ generally have a temperature of 110° C. For this reason, it can be said that the resin A is not suitable as a resin material used in the resin layer 24 of the light emitting apparatus 10. It is necessary to use the resin B and C as the resin material of the resin layer 24.

Figure 13:
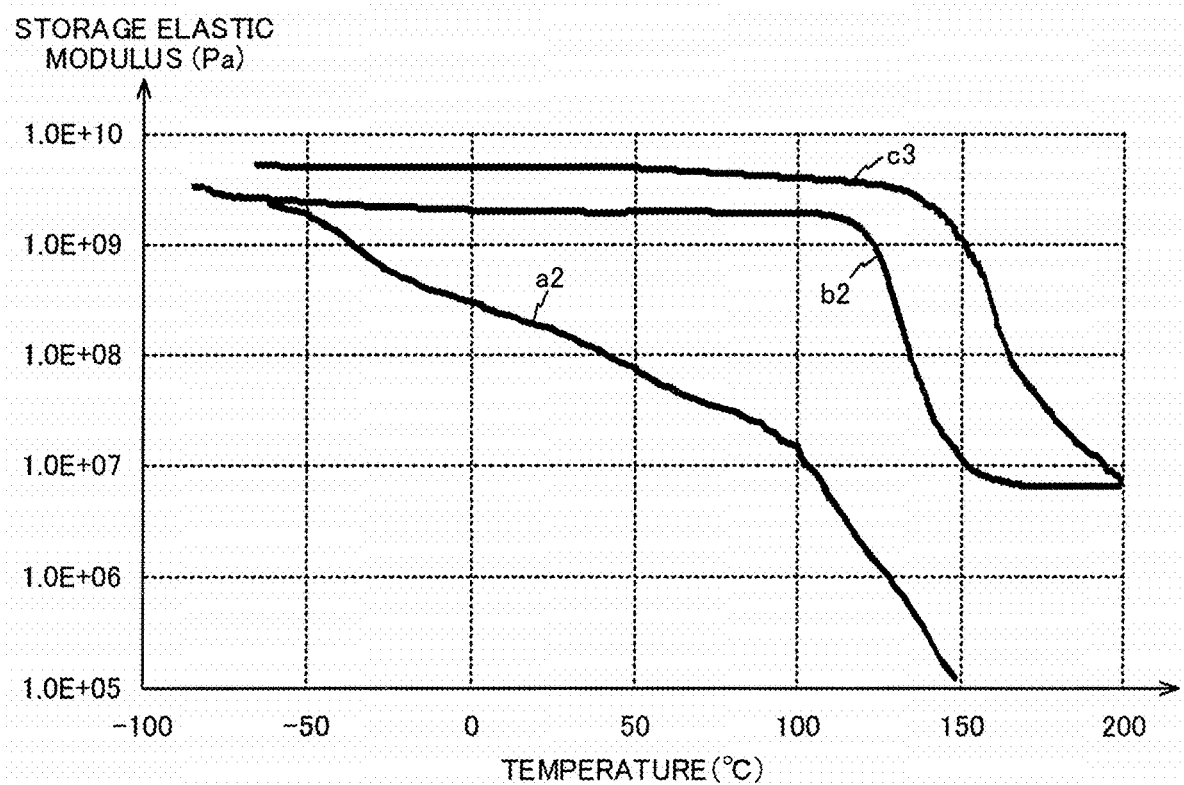
FIG. 13 is a diagram illustrating a relationship between temperatures of resin A to C and a storage elastic modulus.

FIG. 13 is a diagram illustrating a relationship between the temperature and the storage elastic modulus (Pa) of the resin A to C. The plot a2 indicates temperature dependency of the storage elastic modulus of the resin A. The plot b2 indicates temperature dependency of the storage elastic modulus of the resin B. The plot c2 indicates temperature dependency of the storage elastic modulus of the resin C.

As illustrated in FIG. 13, the storage elastic moduli of the resin B and C are nearly constant within a range of −100° C. to 100° C. In comparison, the storage elastic modulus of the resin A decreases across a range of −50° C. to 100° C. If the temperature is higher than 100° C., the rate of decrease increases.

A ratio of the 100° C. storage elastic modulus relative to the −50° C. storage elastic modulus was −99.7% in the case of the resin A. The same ratios for the resin B and C were −26.1% and −24.5%, respectively. Therefore, in order to operate the light emitting apparatus 10 for 1000 hours without failure under the high-temperature test environment as shown in the results of FIG. 12, the ratio of the 100° C. storage elastic modulus relative to the −50° C. storage elastic modulus of the resin layer 24 is preferably higher than −99%, more preferably −50% or higher, and most preferably −26% or higher.

Figure 14:
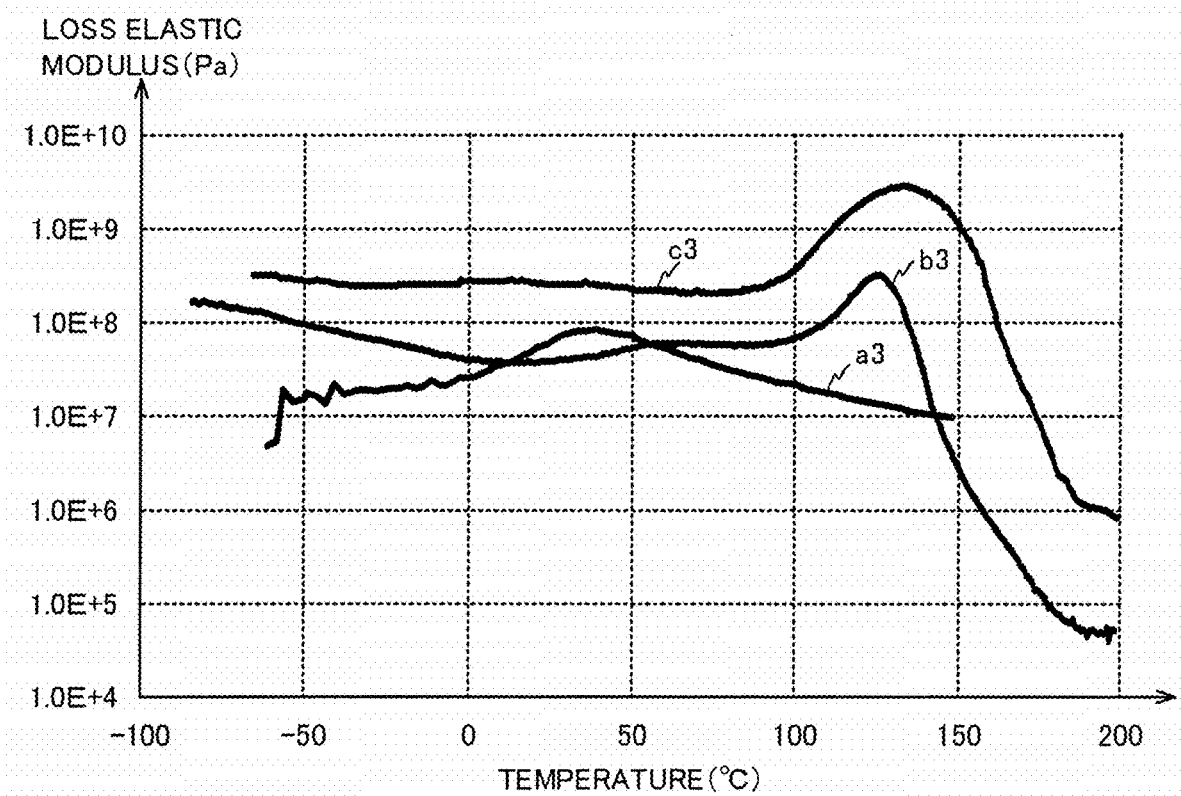
FIG. 14 is a diagram illustrating a relationship between temperatures of resin A to C and a loss elastic modulus.

FIG. 14 is a diagram illustrating a relationship between the temperature and the loss elastic modulus (Pa) of the resin A to C. The plot a3 indicates temperature dependency of the loss elastic modulus of the resin A. The plot b3 indicates temperature dependency of the loss elastic modulus of the resin B. The plot c3 indicates temperature dependency of the loss elastic modulus of the resin C. As illustrated in FIG. 14, the loss elastic moduli of the resin B and C are nearly constant from −50° C. to the vicinity of 100° C. The loss elastic moduli of the resin B and C have peaks between 120° C. and 140° C.

Meanwhile, the loss elastic modulus of the resin A increases within a range of −50° C. to 40° C., and has peaks in the vicinity of 40° C. The loss elastic modulus of the resin A gradually decreases when the resin A has a temperature of 40° C. or higher. Therefore, in order to operate the light emitting apparatus 10 for 1000 hours without failure under the high-temperature test environment as shown by the results in FIG. 12, the loss elastic modulus of the resin layer preferably has a peak at a temperature of 40° C. or higher. Furthermore, it is more preferable for the loss elastic modulus of the resin layer to have a peak at a temperature of 110° C. or higher, and most preferable for it to have a peak at a temperature of 130° C. or higher.

Figure 15:
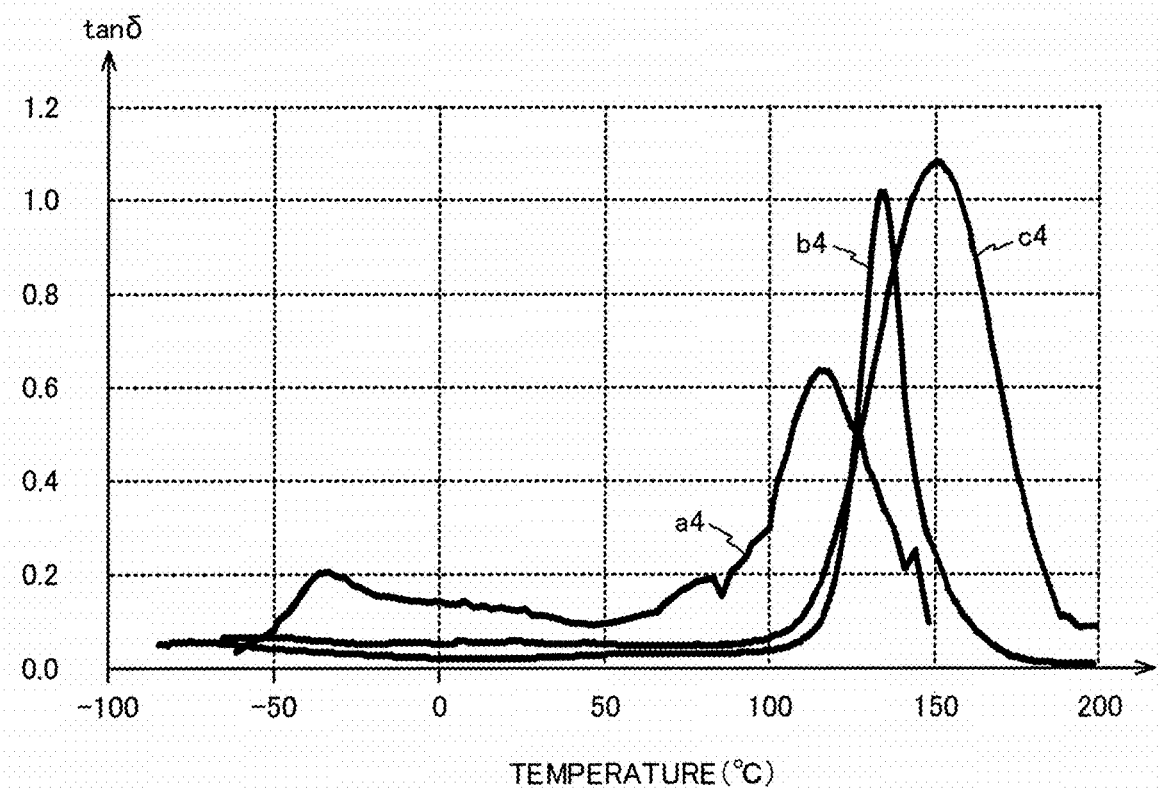
FIG. 15 is a diagram illustrating a relationship between temperatures of resin A to C and a mechanical loss tangent tan δ.

FIG. 15 is a diagram illustrating the relationship between the temperature and the mechanical loss tangent tan δ of the resin A to C. The plot a4 indicates the temperature dependency of the mechanical loss tangent tan δ of the resin A. The plot b4 indicates temperature dependency of the mechanical loss tangent tan δ of the resin B. The plot c4 indicates temperature dependency of the mechanical loss tangent tan δ of the resin C. As indicated in the plot a4, the temperature at which the mechanical loss tangent tan δ of the resin A is maximized is 117° C. Furthermore, the temperature at which the mechanical loss tangent tan δ of the resin B is maximized is 135° C., and the temperature at which the mechanical loss tangent tan δ of the resin C is maximized is 150° C.

The temperatures at which the mechanical loss tangents tan δ of the resin A to C have peaks are 117° C., 135° C., and 150° C., respectively. For this reason, it can be said that the higher the temperature at which the mechanical loss tangent tan δ of the resin material of the resin layer 24 is maximized, the fewer defective elements the light emitting apparatus 10 has under the test environment.

The table of FIG. 16 shows the number of non-defectives under three conditions of Condition 1, Condition 2, and Condition 3, in which the humidities were 25%, 60%, and 85% respectively, and the temperature was 85° C., assuming that the junction temperature Tj was set to 105° C., and the ten light emitting apparatuses 10A, 10B, and 10C were operated for 1000 hours. In the case of a humidity of 25%, the number of non-defectives of the light emitting apparatus 10A was "eight", and the number of non-defectives of the light emitting apparatuses 10B and 10C was "ten". In the case of a humidity of 60%, the number of non-defectives of the light emitting apparatus 10A was "six", and the number of non-defectives of the light emitting apparatuses 10B and 10C was "ten". In the case of a humidity of 85%, the number of non-defectives of the light emitting apparatus 10A was "five", and the number of non-defectives of the light emitting apparatuses 10B and 10C was "ten".

Note that no failure occurred in the light emitting apparatuses when the light emitting apparatuses 10A, 10B, and 10C were similarly operated for 1000 hours after setting the temperatures of the resin A to C to 25° C. and 60° C.

As illustrated in FIG. 16, the light emitting apparatus 10 with the resin layer 24 formed of the resin B has no defective element when it is operated for 1000 hours under the test environment. Therefore, for the resin material used in the resin layer 24, the temperature at which the mechanical loss tangent tan δ is maximized is preferably higher than 117° C., more preferably 130° C. or higher, and most preferably 135° C. or higher.

In general, it is known that the peak intensity of the mechanical loss tangent tan δ indicates contribution to the viscosity of the viscoelasticity. This means that, because toughness is higher in a plastic deformation region where elasticity surpasses an elastic limitation, an amount of deformation in the resin caused by a change of the viscoelasticity is small even when over the elastic limitation. This means that the bonded resin does not easily fail even at a temperature where the elasticity of the resin is over the elastic limitation, and therefore a device does not easily fail because the resin holding an electrical connecting portion between the conductor layer and the light emitting element is stabilized in the test under the high-temperature and high-humidity environment as shown by the results in FIG. 12.

In the test results illustrated in FIG. 12, the peak intensity of the mechanical loss tangent tan δ is 0.64 for the resin A, 1.01 for the resin B, and 1.08 for the resin C (refer to FIG. 15). There is less occurrence of failure in the resin B and C with 1 or more peak intensities of the mechanical loss tangent tan δ, compared to the resin A with a peak intensity of the mechanical loss tangent tan δ of 0.64. Therefore, the peak intensity of the mechanical loss tangent tan δ is preferably 0.64 or more, more preferably 0.8 or more, and most preferably 1.01 or more.

In the examples, a flexible and light-transmissive light emitting apparatus 10 is the essence of this disclosure. It was discovered that if the temperature at which the mechanical loss tangent tan δ is maximized is higher than 180° C., a characteristic of this disclosure, that is, the light emitting apparatus having flexibility and light transmissive property, is somewhat lost.

As shown in the table of FIG. 16, focusing on the resin A, it is recognized that, as the humidity increases, the number of the light emitting apparatuses that do not remain lit over the course of operation for 1000 hours increases, and the number of the light emitting apparatuses determined to be non-defective decreases.

Figure 17:
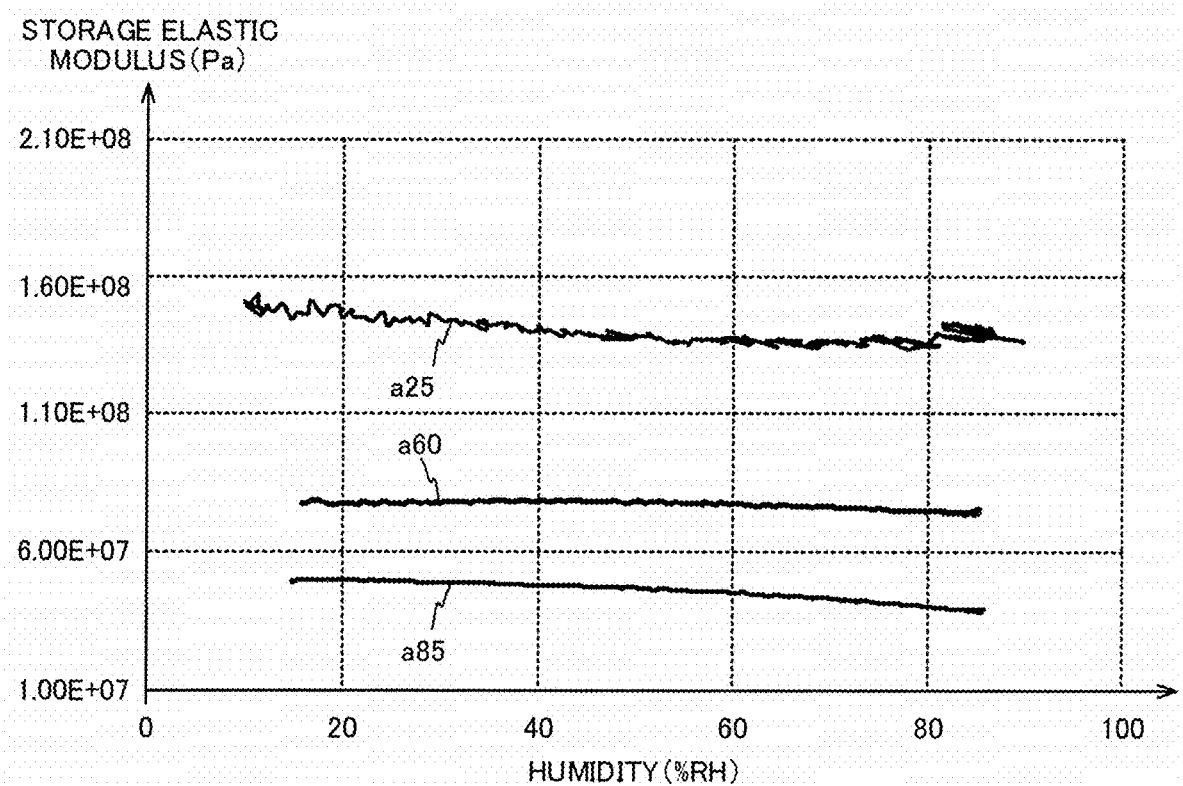
FIG. 17 is a diagram illustrating a relationship between the humidity of the resin A and the storage elastic modulus.

FIG. 17 is a diagram illustrating a relationship between the humidity and the storage elastic modulus (Pa) of the resin A. The plot a25 indicates humidity dependency of the storage elastic modulus of the resin A at a temperature of 25° C. The plot a60 indicates humidity dependency of the storage elastic modulus of the resin A at a temperature of 60° C. The plot a85 indicates humidity dependency of the storage elastic modulus of the resin A at a temperature of 85° C.

Figure 18:
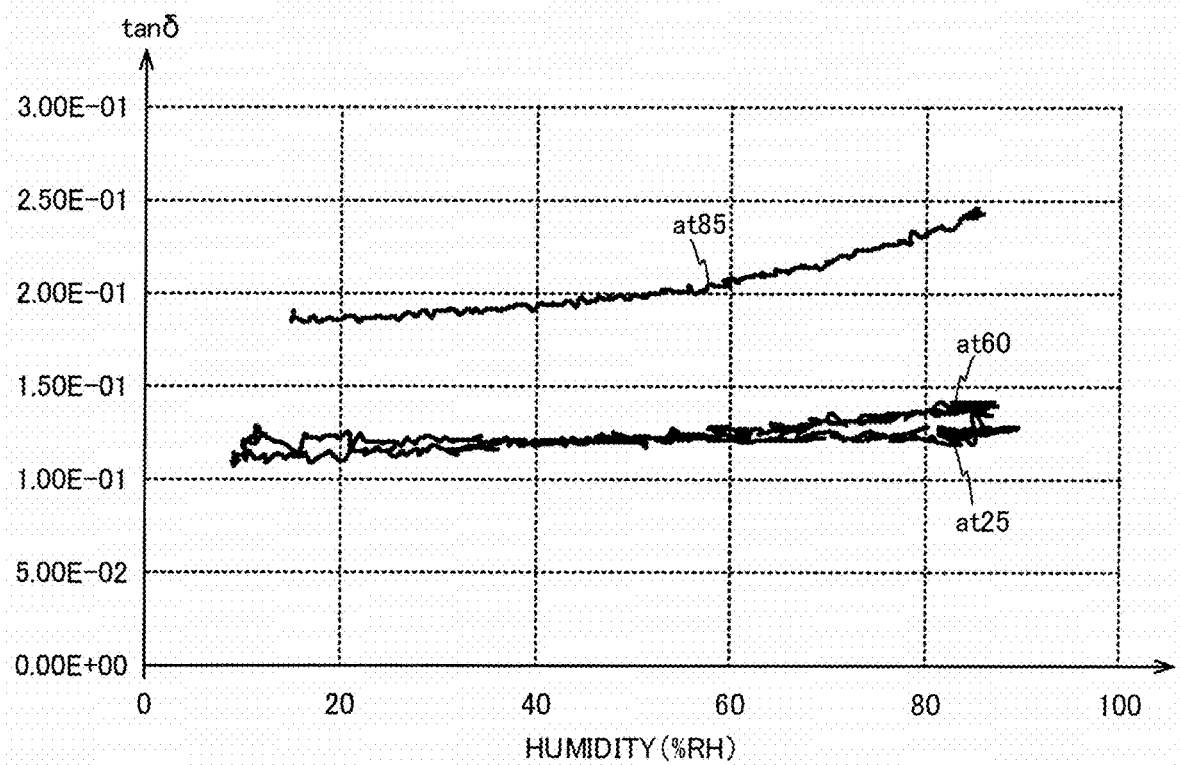
FIG. 18 is a diagram illustrating a relationship between the humidity of the resin A and the mechanical loss tangent tan δ.

FIG. 18 is a diagram illustrating ta relationship between the humidity and the mechanical loss tangent tan δ of the resin A. The plot at25 indicates humidity dependency of the mechanical loss tangent tan δ of the resin A at a temperature of 25° C. The plot at60 indicates humidity dependency of the mechanical loss tangent tan δ of the resin A at a temperature of 60° C. The plot at85 indicates humidity dependency of the mechanical loss tangent tan δ of the resin A at a temperature of 85° C.

The plots a25, a60, and a85, indicating the humidity dependency of the storage elastic modulus of the resin A, have nearly constant values. However, the plots at25, at60, and at85, indicating the temperature dependency of the mechanical loss tangent tan δ of the resin A, have a slope increasing upward to the right as the temperature of the resin A increases. In particular, the plot at85 has a steep slope increasing upward to the right.

As illustrated in the table of FIG. 16, when the resin A has a high temperature such as 85° C., the number of non-defectives is reduced as the humidity increases. In this consideration, it is conceived that there is a relationship between reduction of the number of non-defectives and an increase of the slope of the plot at85. For this reason, it is necessary to select a resin material with a small slope of the plot indicating the humidity dependency of the mechanical loss tangent tan δ as the resin layer 24 of the light emitting apparatus 10 used at a high temperature.

Referring to the plot at85, a change amount within a humidity range of 20% to 85% is "5.55E−02". In addition, a change amount within a humidity range of 50% to 85% is "4.27E−02". In the resin A having the characteristics shown by the plot at85, it was determined that five of the ten light emitting apparatuses 10A are non-defective under Condition 3 as shown in the table of FIG. 16. For this reason, with regards to the resin material of the resin layer 24 of the light emitting apparatus 10, if a change amount within a humidity range of 20% to 85% and a change amount within a humidity range of 50% to 85% are smaller than "5.55E–02" and "4.27E–02", respectively, it can be conceived that a majority of the light emitting apparatuses will be determined as being non-defective under Condition 3.

Then, focusing on the resin B, as shown in the table of FIG. 16, the number of non-defectives under Condition 3 was "ten", and as such it was determined that all of the light emitting apparatuses 10B are non-defective.

Figure 19:
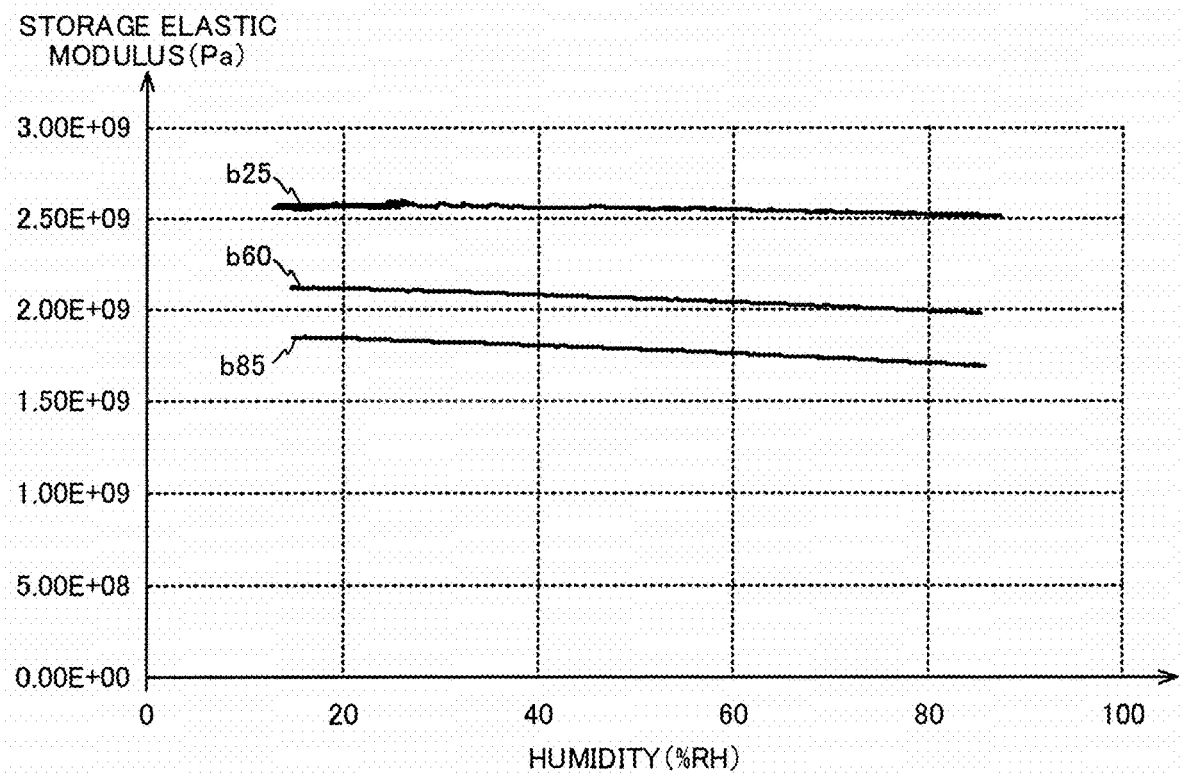
FIG. 19 is a diagram illustrating a relationship between the humidity of the resin B and the storage elastic modulus.

FIG. 19 is a diagram illustrating a relationship between the humidity and the storage elastic modulus (Pa) of the resin B. The plot b25 indicates humidity dependency of the storage elastic modulus of the resin B at a temperature of 25° C. The plot b60 indicates humidity dependency of the storage elastic modulus of the resin B at a temperature of 60° C. The plot b85 indicates humidity dependency of the storage elastic modulus of the resin B at a temperature of 85° C.

Figure 20:
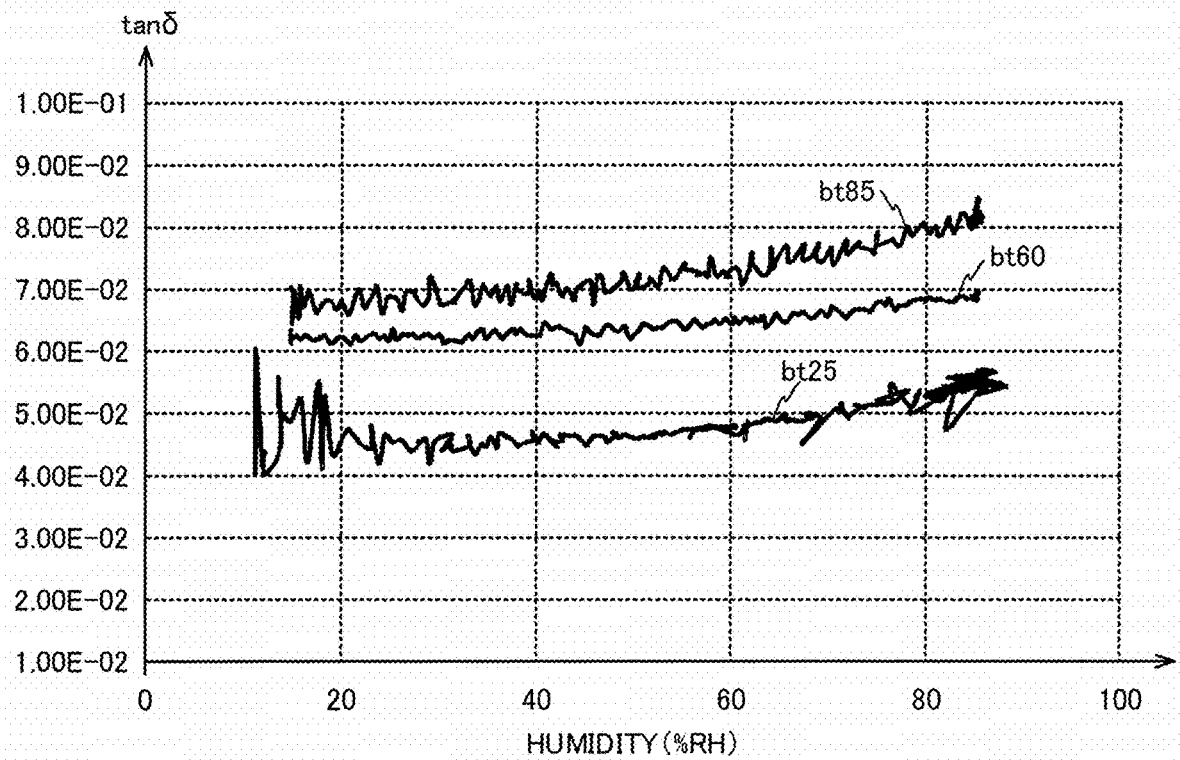
FIG. 20 is a diagram illustrating a relationship between the humidity of the resin B and the mechanical loss tangent tan δ.

FIG. 20 is a diagram illustrating a relationship between the humidity and the mechanical loss tangent tan δ of the resin B. The plot bt25 indicates humidity dependency of the mechanical loss tangent tan δ of the resin B at a temperature of 25° C. The plot bt60 indicates humidity dependency of the mechanical loss tangent tan δ of the resin B at a temperature of 60° C. The plot bt85 indicates humidity dependency of the mechanical loss tangent tan δ of the resin B at a temperature of 85° C.

In order to prevent a difference in the number of non-defectives of the light emitting apparatuses 10 caused by humidity, it is necessary to select a resin material less influenced by a change in humidity, that is, one in which a change of the storage elastic modulus is insignificant depending on a change in humidity.

Comparing the plots a25, a60, and a85 of FIG. 17, it is recognized that the resin A has a smaller storage elastic modulus at a temperature of 85° C., relative to a temperature of 25° C. Similarly, comparing the plots b25, b60, and b85 of FIG. 19, it is recognized that the resin B has a smaller storage elastic modulus at a temperature of 85° C., relative to a temperature of 25° C.

Within a humidity range of 25% to 85%, a decrease rate from an average storage elastic modulus of the resin A at 25° C. to an average storage elastic modulus of the resin A at 85° C. is 69.1%. In addition, a decrease rate from an average storage elastic modulus of the resin B at 25° C. to an average storage elastic modulus of the resin B at 85° C. is 30.6%. It is recognized that the decrease rate (30.6%) of the average value of the resin B is half of the decrease rate (69.1%) of the average value of the resin A.

Therefore, within a humidity range of 25% to 85%, a decrease rate of the resin of the resin layer 24 from the average storage elastic modulus at 25° C. to the average storage elastic modulus at 85° C. is preferably 69% or lower, and most preferably 30.6% or lower.

Similar to the resin A, as recognized from the plots b25, b60, and b85 indicating humidity dependency of the storage elastic modulus of the resin B, the storage elastic modulus of the resin B becomes nearly constant. However, referring to the plots bt25, bt60, and bt85 indicating temperature dependency of the mechanical loss tangent tan δ of the resin B, the slope upward to the right slightly increases as the temperature of the resin B increases. In addition, referring to the plot bt85, a change amount within a humidity range of 20% to 85% is "1.35E–02", and a change amount within a humidity range of 50% to 85% is "9.05E–03".

When the resin A has a temperature of 60° C., all of the light emitting apparatuses are non-defective at humidities of 30%, 50%, and 85%. Therefore, in the plot at60 in FIG. 18, a change amount of the mechanical loss tangent tan δ within a humidity range of 20% to 85% is preferably "2.97E–02" or smaller, and a change amount of the mechanical loss tangent tan δ within a humidity range of 50% to 85% is "1.63E–02" or smaller.

Therefore, it is preferable that a change amount within a humidity range of 20% to 85% is "5.55E–02" or smaller, and a change amount within a humidity range of 50% to 85% is "4.27E–02" or smaller. More preferably, a change amount within a humidity range of 20% to 85% is "2.97E–02" or smaller, and a change amount within a humidity range of 50% to 85% is "1.63E–02" or smaller. Furthermore, it is conceivable that, by using a resin material with a change amount within a humidity range of 20% to 85% set to "1.35E–02" and a change amount within a humidity range of 50% to 85% set to "9.05E–03" as the resin layer of the light emitting apparatus 10, the number of non-defectives under Conditions 1 to 3 can increase to a majority or more of the number of samples.

If the resin layer 24 of the light emitting apparatus 10 expands by absorbing moisture under the influence of humidity, the pads 23P and the bumps 37 and 38 will be separated, thus losing electrical contact in a place where the resin is hardened around a small area where an electrical connection of several tens of micrometers or smaller has been attained between the bumps 37 and 38 of the light emitting elements $30_1$ to $30_8$ held by the resin layer 24 and the pad 23P of the conductor patterns 23a to 23i. As a result, contact failure occurs between the conductor layer 23 and the bumps 37 and 38. For this reason, in order to improve the reliability of the light emitting apparatus 10, it is necessary to set an expansion coefficient of the resin layer 24 to a predetermined value or lower.

Note that the expansion coefficient of the resin is a value measured using a humidity control type thermomechanical analyzer (TMA) produced by NETZSCH Japan K.K. on the basis of the standard JIS K 7197.

Figure 21:
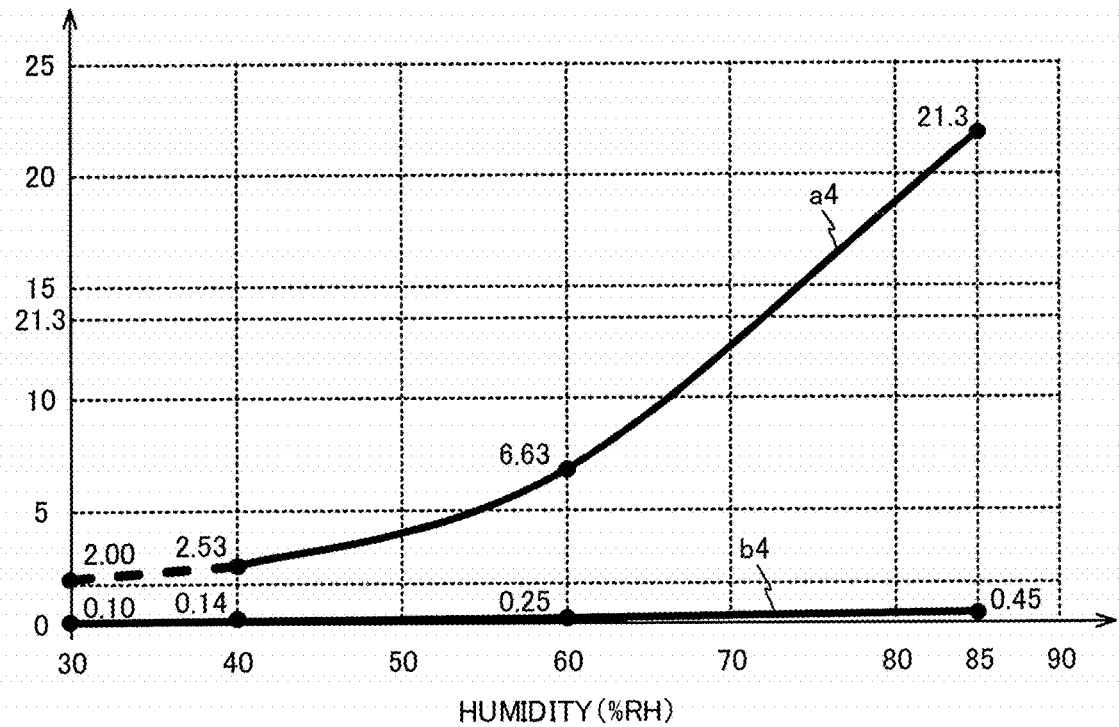
FIG. 21 is a diagram illustrating a relationship between the humidity of the resin A and B and an expansion coefficient.

FIG. 21 is a diagram illustrating a relationship between humidity and the expansion coefficients of the resin A and B. The plot a4 indicates humidity dependency of the expansion coefficient of the resin A at a temperature of 85° C. The plot b4 indicates humidity dependency of the expansion coefficient of the resin B at a temperature of 85° C. As illustrated in the table of FIG. 16, it can be seen that in the case of the light emitting apparatus 10A using the resin A, as the humidity increases, the number of light emitting apparatuses that do not remain lit over the course of operation for 1000 hours increases, and resultantly the number of light emitting apparatuses determined to be non-defective decreases. Therefore, it is conceivable that there is a relationship between the reduction of the number of non-defectives and an increase of the slope of the plot a4.

As indicated in the plot a4 that shows the humidity dependency of the expansion coefficient of the resin A, the expansion coefficient of the resin A at a humidity of 85% becomes 21.3%. As illustrated in FIG. 16, at an expansion coefficient of 21.3%, that is, at a humidity of 85%, the number of non-defectives becomes "five". For this reason, it is conceived that a majority of the samples would be non-defective if the expansion coefficient of the resin of the resin layer 24 of the light emitting apparatus 10 is smaller than 21.3%. For this reason, the resin of the resin layer 24 preferably has an expansion coefficient smaller than 21.3%.

Referring to FIG. 16, the number of non-defectives of the resin A at a humidity of 30% is larger than the number of non-defectives at a humidity of 85%. For this reason, it is recognized that the expansion coefficient of the resin A at a humidity of 30% is approximately 2.0% when a part with a humidity of 40% or lower is extrapolated onto the graph in FIG. 21. For this reason, it is more preferable that the resin has an expansion coefficient of 2.0% or smaller.

As indicated in the plot b4 showing the humidity dependency and the expansion coefficient of the resin B, the expansion coefficient of the resin B at a humidity of 85% becomes 0.45%. As illustrated in FIG. 16, in the case of the resin B, all of the samples are determined as being non-defective at a humidity of 85%. For this reason, it is conceivable that it is most preferable that the resin of the resin layer 24 has an expansion coefficient of 0.45% or smaller.

When the light emitting apparatus 10 is used, a resin having characteristics suitable for an operating environment of the light emitting apparatus 10 may be employed in the resin layer 24. For example, in a case where the light emitting apparatus 10 is used in an environment with a temperature of 85° C., a relationship between a difference $\Delta Tj$ between the junction temperature Tj of the light emitting element and the environmental temperature, and a peak temperature tan $\delta$ max at which the mechanical loss tangent tan $\delta$ of the resin layer 24 is maximized preferably satisfies the conditions of the following Formulas (1) and (2). Note that "$\alpha$" denotes a coefficient indicating a manufacturing variation factor in the thickness of the resin layer 24. In the manufacturing method disclosed in this embodiment, the coefficient $\alpha$ is set to 0.92 to 1.08. "TM" denotes an environmental temperature (° C.).

$$\tan \delta \text{ max} \geq 1.65 \Delta Tj + \alpha \times D \tag{1}$$

$$\alpha \times D = 1.65 \times TM - 47.5 \tag{2}$$

Figure 22:
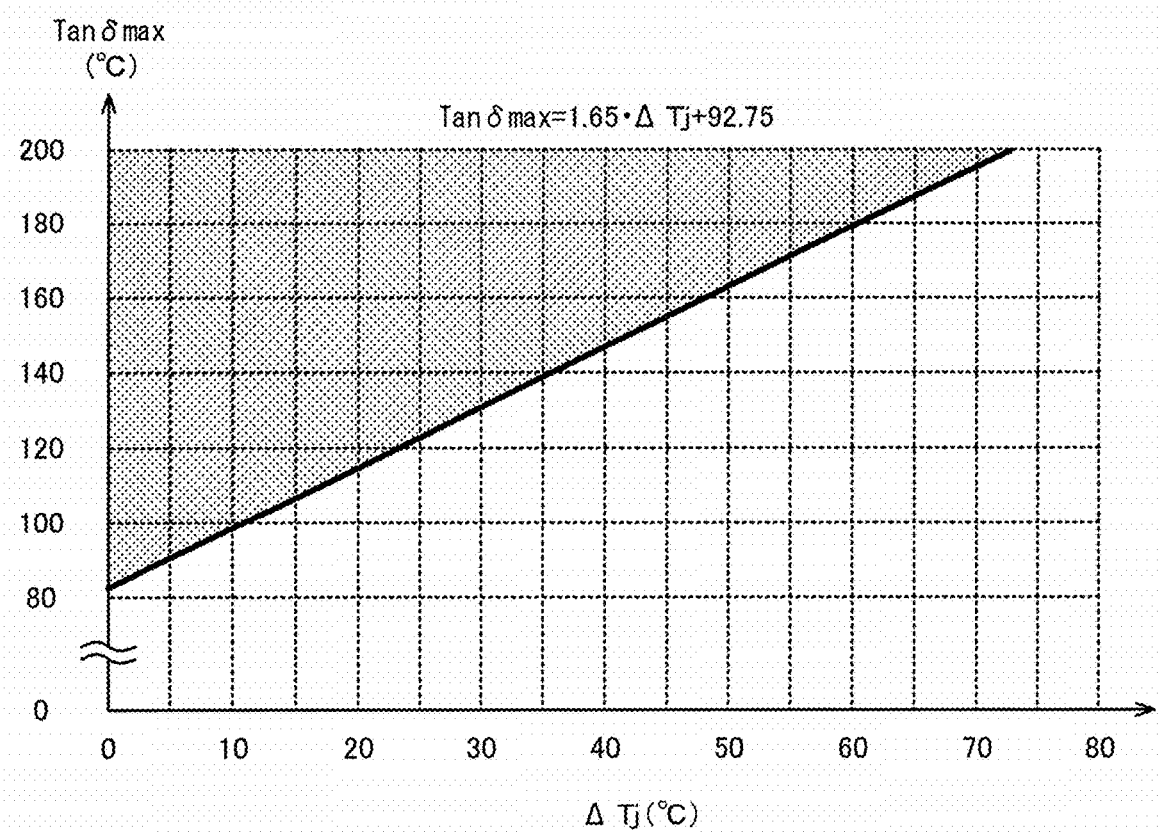
FIG. 22 is a diagram illustrating a relationship between a difference ΔTj between a junction temperature Tj and an environmental temperature and a peak temperature tan δ max when the mechanical loss tangent tan δ of the resin layer is maximized.

FIG. 22 shows the range shown by the above Formula (1) when the ambient temperature is 85° C. The right side of the aforementioned formula refers to the peak temperature of the mechanical loss tangent tan $\delta$ corresponding to the maximum junction temperature of each resin when the number of non-defectives becomes "ten" in FIG. 12. Therefore, by selecting the resin of the resin layer 24 of the light emitting apparatus 10 so as to satisfy the condition of the aforementioned Formula (1), it is possible to set the number of the light emitting apparatuses determined as being defective under the test environment to nearly zero.

As described above, since the resin layer in the light emitting apparatus according to this embodiment is formed of the resin with the relationship between the peak temperature tan $\delta$ max when the mechanical loss tangent tan $\delta$ in the dynamic viscoelasticity of the resin layer is maximized and the difference $\Delta T$ between the junction temperature of the light emitting element and the environmental temperature is represented by the formula (1), it is possible to provide a highly reliable light emitting apparatus.

In the light emitting apparatus according to this embodiment, it is possible to provide a highly reliable light emitting apparatus by using, as the resin layer, the resin whose temperature at which the mechanical loss tangent tan $\delta$ in dynamic viscoelasticity is maximum is 115° C.

In the light emitting apparatus according to this embodiment, it is possible to provide a highly reliable light emitting apparatus by using, as the resin layer, the resin in which the amount of change in mechanical loss tangent tan $\delta$ in dynamic viscoelasticity is 5.55E−02 or less within the humidity range of 20% to 85%.

In the light emitting apparatus according to this embodiment, the resin having the change amount of mechanical loss tangent tan $\delta$ in dynamic viscoelasticity of 4.27E−02 or less is used as the resin layer in the range of humidity of 50% to 85%. Thus, it is possible to provide a highly reliable light emitting device.

In the light emitting apparatus according to this embodiment, the resin layer is formed of resin in which the expansion coefficient at a temperature of 85° C. and a humidity of 40% or higher and 85% or lower is lower than 21.3%. Therefore, it is possible to provide a highly reliable light emitting apparatus.

In a case where the light emitting elements $30_1$ to $30_8$ have a thickness of 90 to 300 μm, it is preferable that the resin layer 24 has a thickness of 90 to 350 μm. The resin layer 24 preferably has a linear expansion coefficient of 40 to 80 ppm/° C. The resin layer 24 formed of polyethylene or polystyrene preferably has a Young's modulus of 0.3 to 10 GPa, and the resin layer 24 formed of epoxy preferably has a Young's modulus of approximately 2.4 GPa. The resin layer 24 preferably has an elastic modulus of 1900 to 4900 MPa and a haze of 10% or lower. In addition, the resin layer 24 preferably has a b* value of 0.5 to 5 and a light transmittance of 30% or higher.

Assuming that the light emitting apparatus 10 is used at a high temperature (85° C.), if an external stress is applied to bend the light emitting apparatus, there is a guarantee of connection stability to hold the light emitting element when the resin layer has a high bending stress value. Meanwhile, in the case of an excessive stress, the resin layer is plastically deformed and loses stability. In the case of a low bending stress value, the resin layer is immediately plastically deformed by an external stress and loses connection stability.

When the light emitting apparatus is used in a context where a thermal shock is applied, such as a case where it is taken out from an indoor environment in summer, as well as a case where a bending stress is applied at a high temperature, the connection stability will be low if an absolute value of a change rate of the bending stress relative to a temperature change from a low temperature to a high temperature is large. Conversely, if the change rate of the bending stress is small, the connection stability is high.

FIG. 23 is a table showing a measurement result of bending stress for the resin A, B, and C at temperatures of 23° C. and 85° C. The measurement was performed such that a light emitting panel 20 with a thickness of 120 μm was placed on a double-sided jig with a gap of 3 mm, and a distortion factor and a load were measured by pressing an insertion depressor against the substrate in an atmosphere set at a predetermined temperature. Note that the bending stress value shown in the table of FIG. 23 was measured when the distortion factor was at 5%. A digital material tester produced by INSTRON was employed for the measurement.

As shown in the table, the bending stresses of the resin A, B, and C at a temperature of 23° C. were 5.95 MPa, 94.92 MPa, and 123.67 MPa, respectively. The bending stress value of the resin B was one digit higher than that of the resin A. In addition, the bending stress value of the resin C was two digits higher than that of the resin A.

The change rates from the bending stress at 23° C. of the resin A, B, C to the bending stress at 85° C. were −75.2%, −30.8%, and −19.8%, respectively. Although the change rates of all the resin have negative values, only the change rate of the resin A shows a prominent decrease.

Therefore, the resin layer 24 preferably has a bending stress of higher than 1.48 MPa, more preferably of 65.71 MPa or higher, and most preferably of 99.2 MPa or higher when the distortion factor is 5% at 85° C. In addition, when within a temperature range of 23° C., which is a temperature similar to room temperature, to 85° C., the change rate of the bending stress is preferably higher than −75.2%, more preferably −30.8% or higher, and most preferably −19.8% or higher.

Regarding the thicknesses of the substrates 21 and 22, if the substrates 21 and 22 are thin, the bumps of the light emitting elements $30_1$ to $30_8$ may penetrate the substrates 21 and 22 in some cases. For this reason, it is preferable that the following conditions are satisfied. The substrates 21 and 22 preferably have a thickness of 30 to 300 μm and a heat resistant temperature of 100° C. or higher. The substrates 21 and 22 preferably have a linear expansion coefficient of 4 to 9 (1/° C.) and an elastic modulus of 2000 to 4100 MPa. The substrates 21 and 22 preferably have a light transmittance of 90% or higher and a heat conductivity of 0.1 to 0.4 W/m·k. The substrates 21 and 22 preferably have a haze of 2% or lower and a b* value of 2 or smaller.

The light emitting elements $30_1$ to $30_8$ preferably have a thickness of 30 to 1000 μm and a one-side length of 30 to 3000 μm.

In the manufacturing process of the light emitting apparatus 10, before the bumps 37 and 38 of the light emitting elements $30_1$ to $30_8$ are bonded via thermocompression, they have a height of 30 to 100 μm. After the thermocompression bonding, they have a height of 20 to 90 μm. The bumps 37 and 38 preferably have a height and width of 30 to 100 μm.

If the conductor layer 23 is excessively thick, a crack may occur in some cases when the light emitting apparatus 10 is bent. In addition, if the conductor layer 23 is excessively thin, its electric resistance increases. Furthermore, if a mesh pattern constituting the conductor layer 23 has a large line width, its transmissive property is degraded. Moreover, if the line width is small, its electric resistance increases, or short-circuiting more easily occurs. The conductor layer 23 preferably has a thickness of 10 μm or smaller. In addition, the mesh pattern constituting conductor layer 23 preferably has a line width of 20 μm or smaller. The conductor layer 23 preferably has a sheet resistance value of 300 ohm/E or smaller and a light transmittance of 50% or higher. The conductor layer 23 preferably has a heat conductivity of 0.2 to 0.33 W/m·k and a haze of 5% or lower. In addition, the conductor layer 23 preferably has a b* value of 2 or smaller.

While the embodiments of this disclosure have been described hereinbefore, this disclosure is not limited by the aforementioned embodiments. For example, the light emitting apparatus 10 having eight light emitting elements 30 have been described in each of the aforementioned embodiments. Without limiting thereto, the light emitting apparatus 10 may have nine or more or seven or less light emitting elements.

A case where the conductor layer 23 is formed of metal has been described in the aforementioned embodiments. Without limiting thereto, the conductor layer 23 may also be formed of a transparent conductive material such as indium tin oxide (ITO).

A case where the resin layer 24 is formed from a pair of resin sheets 241 and 242 has been described in the aforementioned embodiments. Without limiting thereto, the resin layer 24 may be formed from a single resin sheet.

Figure 24:
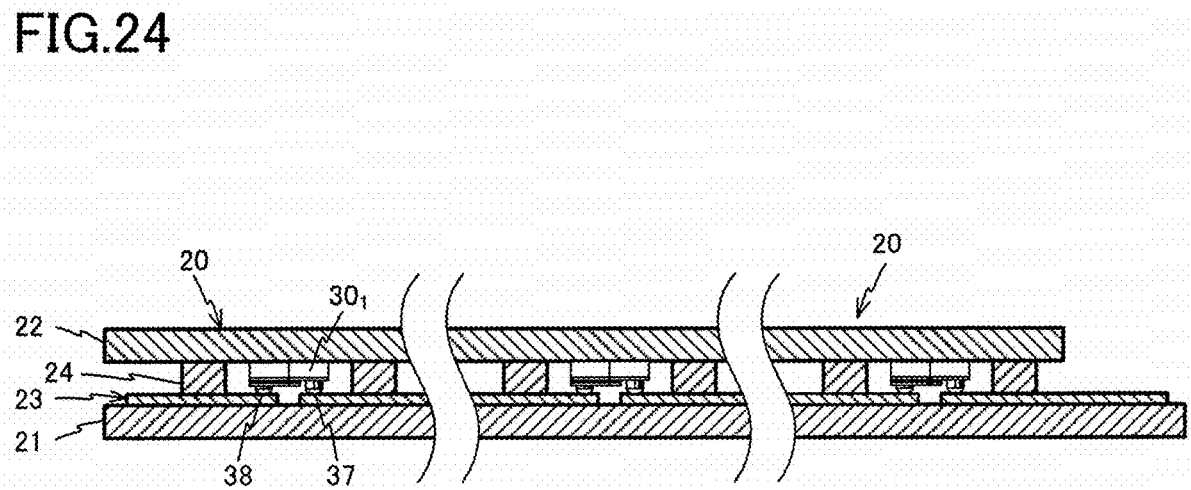
FIG. 24 is a diagram illustrating a modification of the light emitting panel.

A case where the resin layer 24 is formed without a gap between the substrates 21 and 22 has been described in the aforementioned embodiments. Without limiting thereto, the resin layer 24 may be partially formed between the substrates 21 and 22. For example, the resin layer 24 may be formed only around the light emitting element. As an additional example, the resin layer 24 may be formed as a spacer that surrounds the light emitting element 30 as illustrated in FIG. 24.

Figure 25:
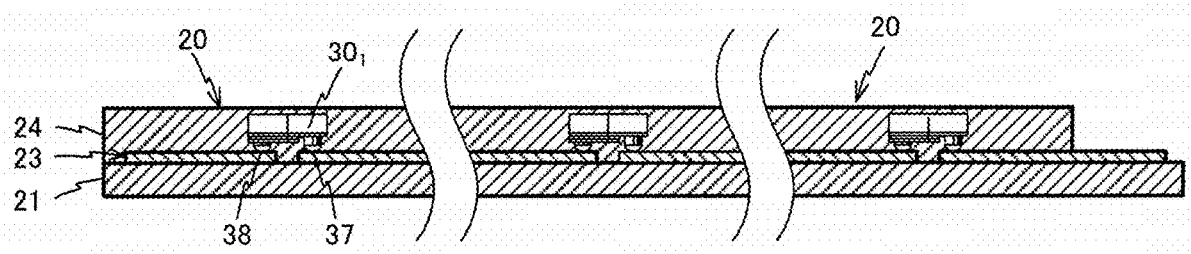
FIG. 25 is a diagram illustrating a modification of the light emitting panel.

A case where the light emitting panel 20 of the light emitting apparatus 10 has the substrates 21 and 22 and the resin layer 24 has been described in the aforementioned embodiments. Without limiting thereto, the light emitting panel 20 may include only the substrate 21 and the resin layer 24 that holds the light emitting element 30 as illustrated in FIG. 25.

Likewise, the resin layer 24 may include only the resin sheet 241 as illustrated in FIG. 11 as long as the bumps 37 and 38 of the light emitting element are connected to the conductor layer 23.

Figure 26:
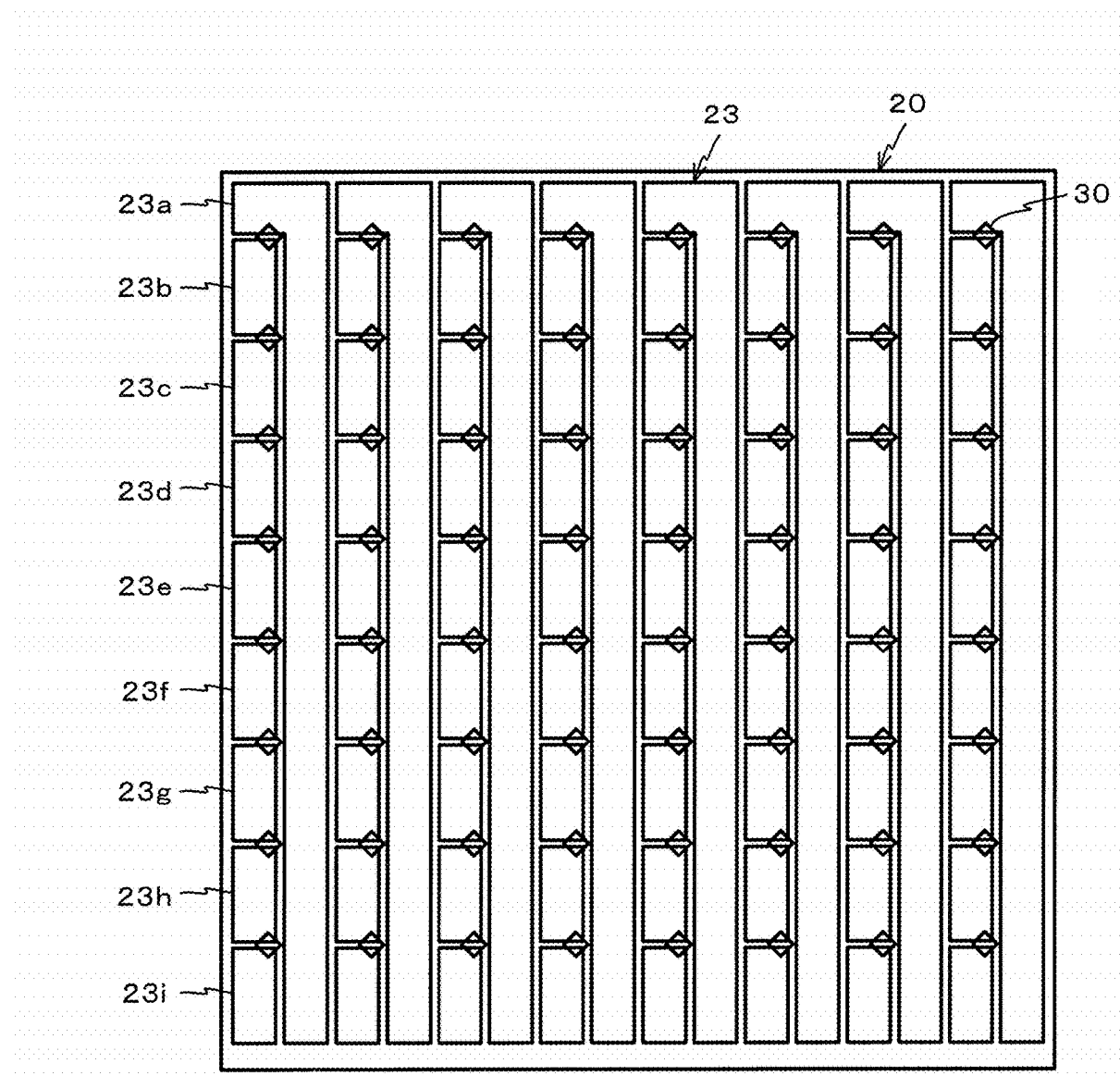
FIG. 26 is a diagram illustrating a modification of the light emitting panel.

The above embodiment has described the case where the light emitting elements 30 are linearly arranged. Without limiting thereto, as shown in FIG. 26, the light emitting elements 30 may be two-dimensionally arranged in a matrix.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A light emitting apparatus comprising:
a first substrate having light transmissive property and flexibility with a conductive layer;
a second substrate having light transmissive property and flexibility and arranged to face the first substrate;
a plurality of light emitting elements including an electrode connected to the conductive layer and arranged between the first and second substrates; and
a resin layer having light transmissive property and flexibility and arranged between the first and second substrates to hold the plurality of light emitting elements,
wherein, in the resin layer, a storage elastic modulus at 100° C. is −26% or more with respect to the storage elastic modulus at −50° C., and a loss elastic modulus peaks at 130° C. or higher, and
as a general condition for providing no failure in a reliability test, a relationship between a peak temperature tan δ max at which a mechanical loss tangent tan δ is maximized in dynamic viscoelasticity of the resin layer and a difference (ΔTj) between a junction temperature (Tj) of the light emitting element and an environmental temperature (TM) satisfies the following formulas (1) and (2):

$$\tan \delta \ max \geq 1.65 \Delta Tj + \alpha \times D \quad (1), \text{ and}$$

$$\alpha \times D = 1.65 \times TM - 47.5 \quad (2),$$

where "TM" denotes the environmental temperature, "Tj" denotes the junction temperature, "D" denotes an integer, and "a" denotes a manufacturing variation factor in a thickness of the resin layer.

2. The light emitting apparatus according to claim 1, wherein a temperature for a maximum mechanical loss tangent tan δ in dynamic viscoelasticity of the resin layer is 135° C. or higher.

3. The light emitting apparatus according to claim 2, wherein
the temperature for the maximum mechanical loss tangent tan δ is 180° C. or lower.

4. The light emitting apparatus according to claim 2, wherein
the mechanical loss tangent tan δ has a peak intensity of 1.01 or larger.

5. The light emitting apparatus according to claim 2, wherein
a decrease rate of the resin of the resin layer from an average value of a storage elastic modulus at 25° C. to an average value of a storage elastic modulus at 85° C. is 30.6% or lower within a humidity range of 25% to 85%.

6. The light emitting apparatus according to claim 1, wherein
a change amount of a mechanical loss tangent tan δ in dynamic viscoelasticity of the resin layer is "1.35E−02" or smaller within a humidity range of 20% or higher and 85% or lower.

7. The light emitting apparatus according to claim 6, wherein
the change amount of the mechanical loss tangent tan δ in the dynamic viscoelasticity of the resin layer is "9.05E−03" or smaller within a humidity range of 50% or higher and 85% or lower.

8. The light emitting apparatus according to claim 1, wherein
the resin layer has an expansion coefficient of smaller than 21.3% at a temperature of 85° C. and a humidity of 40% or higher and 0.45% or lower.

9. The light emitting apparatus according to claim 1, wherein
the resin layer has a bending stress of 65.71 MPa or more at a temperature of 85° C. and a distortion factor is 5.0%.

10. The light emitting apparatus according to claim 1, wherein
in the resin layer, the rate of change in bending stress from bending stress at a temperature of 25° C. to bending stress at a temperature of 85° C. is greater than −30.8% when a distortion factor is 5.0%.

11. A light emitting apparatus comprising:
a first substrate having light transmissive property and flexibility with a conductive layer;
a second substrate having light transmissive property and flexibility and arranged to face the first substrate;
a plurality of light emitting elements including an electrode connected to the conductive layer and arranged between the first and second substrates; and
a resin layer having light transmissive property and flexibility and arranged between the first and second substrates to hold the plurality of light emitting elements,
wherein, in the resin layer, a storage elastic modulus at 100° C. is −26% or more with respect to the storage elastic modulus at −50° C., and a loss elastic modulus peaks at 130° C. or higher, and
a relationship between a peak temperature tan δ max at which a mechanical loss tangent tan δ is maximized in dynamic viscoelasticity and a difference ($\Delta Tj$) between a junction temperature (Tj) of the light emitting element and an environmental temperature (TM) in the resin of the resin layer satisfies the following formulas (1) and (2):

$$\tan \delta \, \max \geq 1.65 \Delta Tj + \alpha \times D \quad (1), \text{ and}$$

$$\alpha \times D = 1.65 \times TM - 47.5 \quad (2),$$

where "TM" denotes the environmental temperature, "Tj" denotes the junction temperature, "D" denotes an integer, and "α" denotes a manufacturing variation factor in a thickness of the resin layer.

* * * * *